United States Patent
Lee

(10) Patent No.: US 9,219,458 B2
(45) Date of Patent: Dec. 22, 2015

(54) METHODS AND SYSTEMS OF AGC AND DC CALIBRATION FOR OFDM/OFDMA SYSTEMS

(75) Inventor: Chae Kwan Lee, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 953 days.

(21) Appl. No.: 12/137,546

(22) Filed: Jun. 12, 2008

(65) Prior Publication Data
US 2009/0310690 A1    Dec. 17, 2009

(51) Int. Cl.
*H04L 27/08* (2006.01)
*H03G 3/30* (2006.01)

(52) U.S. Cl.
CPC ........... *H03G 3/3052* (2013.01); *H03G 3/3078* (2013.01)

(58) Field of Classification Search
CPC .......................... H03G 3/3052; H03G 3/3078
See application file for complete search history.

(56) References Cited

U.S. PATENT DOCUMENTS

| | | | |
|---|---|---|---|
| 6,873,833 B2 | 3/2005 | Yang et al. | |
| 6,901,121 B1* | 5/2005 | Dubrovin et al. | 375/346 |
| 6,993,291 B2* | 1/2006 | Parssinen et al. | 455/67.11 |
| 7,340,662 B1* | 3/2008 | McElwee | G01R 31/3167 |
| | | | 714/733 |
| 7,471,748 B2 | 12/2008 | Habuka et al. | |
| 7,593,705 B2 | 9/2009 | Sato et al. | |
| 7,729,675 B2* | 6/2010 | Krone | 455/234.1 |
| 2004/0004933 A1 | 1/2004 | Zhu et al. | |
| 2004/0071238 A1* | 4/2004 | Khlat | H03F 1/304 |
| | | | 375/346 |
| 2004/0202102 A1* | 10/2004 | Kim et al. | 370/208 |
| 2004/0242177 A1 | 12/2004 | Yang | |
| 2004/0264608 A1 | 12/2004 | Habuka et al. | |
| 2005/0062513 A1* | 3/2005 | Sim | 327/307 |
| 2005/0120282 A1* | 6/2005 | Kim | 714/707 |
| 2005/0143121 A1* | 6/2005 | Huh et al. | 455/522 |
| 2007/0072571 A1* | 3/2007 | Sun et al. | 455/280 |
| 2007/0237246 A1* | 10/2007 | Lim et al. | 375/260 |
| 2008/0002792 A1 | 1/2008 | Shalev | |
| 2008/0182543 A1* | 7/2008 | Yang et al. | 455/296 |
| 2008/0198949 A1* | 8/2008 | Okuni et al. | 375/318 |
| 2009/0135945 A1* | 5/2009 | Lee et al. | 375/285 |

(Continued)

FOREIGN PATENT DOCUMENTS

| | | |
|---|---|---|
| EP | 0657997 | 6/1995 |
| EP | 1684437 | 7/2006 |
| GB | 2417869 | 3/2006 |

(Continued)

OTHER PUBLICATIONS

International Search Report and Written Opinion—PCT/US09/047127, International Searching Authority—European Patent Office, Oct. 26, 2009.

*Primary Examiner* — Shuwang Liu
*Assistant Examiner* — Gina McKie
(74) *Attorney, Agent, or Firm* — Charles Chesney

(57) ABSTRACT

Methods and apparatus for automatic gain control (AGC) and DC calibration for orthogonal frequency-division multiplexing (OFDM) or orthogonal frequency division multiple access (OFDMA) systems are provided in an effort to avoid saturation of the analog-to-digital converter (ADC) in a radio frequency (RF) front end of a receiver, to handle dynamic received signal power, or to avoid interruptions in a communication link for DC calibration. For certain embodiments, the quantization error in the RF front end may also be decreased.

25 Claims, 15 Drawing Sheets

(56) References Cited

U.S. PATENT DOCUMENTS

2009/0135970 A1* 5/2009 Miyagi et al. .................. 375/345
2009/0264090 A1* 10/2009 Ivonnet et al. ............. 455/233.1

FOREIGN PATENT DOCUMENTS

| | | |
|---|---|---|
| JP | 2002152173 A | 5/2002 |
| JP | 2002290177 A | 10/2002 |
| JP | 2005020120 | 1/2005 |
| JP | 2006135374 A | 5/2006 |
| JP | 2006217399 A | 8/2006 |
| JP | 2007538469 A | 12/2007 |
| WO | WO2004023667 | 3/2004 |
| WO | WO2004084460 | 9/2004 |
| WO | WO2005117415 | 12/2005 |
| WO | 2007056020 A1 | 5/2007 |
| WO | 2007123733 A2 | 11/2007 |
| WO | 2008039294 A2 | 4/2008 |

* cited by examiner

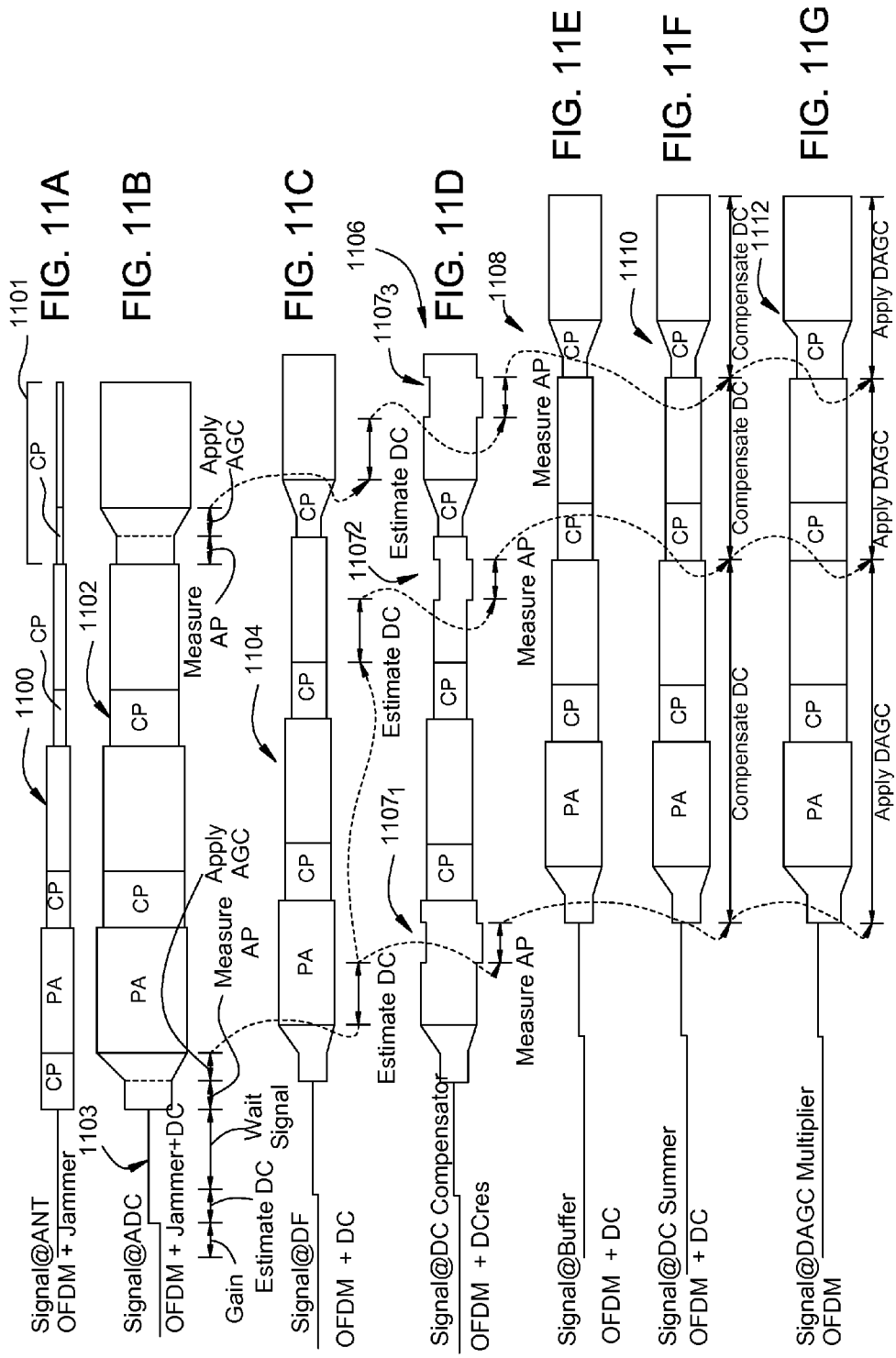

METHODS AND SYSTEMS OF AGC AND DC CALIBRATION FOR OFDM/OFDMA SYSTEMS

TECHNICAL FIELD

Certain embodiments of the present disclosure generally relate to wireless communication and, more particularly, to automatic gain control (AGC) and DC calibration for orthogonal frequency-division multiplexing (OFDM) or orthogonal frequency division multiple access (OFDMA) systems.

BACKGROUND

OFDM and OFDMA wireless communication systems under IEEE 802.16 use a network of base stations to communicate with wireless devices (i.e., mobile stations) registered for services in the systems based on the orthogonality of frequencies of multiple subcarriers and can be implemented to achieve a number of technical advantages for wideband wireless communications, such as resistance to multipath fading and interference. Each base station emits and receives radio frequency (RF) signals that convey data to and from the mobile stations.

A mobile station may include an RF front end with suitable circuitry for receiving the transmitted signals from a base station and processing the received signals in preparation for demodulation and decoding. The signal processing may include automatic gain control (AGC) and DC calibration. Proper AGC and DC calibration are important in order to increase the signal-to-interference-plus-noise ratio (SINR) without saturating the RF front end, thereby possibly leading to invalid data.

SUMMARY

Certain embodiments of the present disclosure generally relate to automatic gain control (AGC) and DC calibration for orthogonal frequency-division multiplexing (OFDM) or orthogonal frequency division multiple access (OFDMA) systems in an effort to avoid saturation of the analog-to-digital converter (ADC) in a radio frequency (RF) front end of a receiver. For certain embodiments, the quantization error in the RF front end may also be decreased.

Certain embodiments of the present disclosure provide a method for AGC in a wireless communication system. The method generally includes estimating power of a received signal from an output of an ADC; adjusting an analog gain based on the estimated received signal power; estimating an adjusted signal power from an output of a digital filter while using the adjusted analog gain, wherein the output of the ADC is input to the digital filter; and adjusting a digital gain based on the estimated adjusted signal power.

Certain embodiments of the present disclosure provide a receiver for wireless communication. The receiver generally includes first estimation logic configured to estimate power of a received signal from an output of an ADC; first adjustment logic configured to adjust an analog gain based on the estimated received signal power; second estimation logic configured to estimate an adjusted signal power from an output of a digital filter while using the adjusted analog gain, wherein the output of the ADC is input to the digital filter; and second adjustment logic configured to adjust a digital gain based on the estimated adjusted signal power.

Certain embodiments of the present disclosure provide an apparatus for AGC in a wireless communication system. The apparatus generally includes means for estimating power of a received signal from an output of an ADC; means for adjusting an analog gain based on the estimated received signal power; means for estimating an adjusted signal power from an output of a digital filter while using the adjusted analog gain, wherein the output of the ADC is input to the digital filter; and means for adjusting a digital gain based on the estimated adjusted signal power.

Certain embodiments of the present disclosure provide a mobile device. The mobile device generally includes a receiver front end for receiving a signal; first estimation logic configured to estimate power of the received signal from an output of an ADC; first adjustment logic configured to adjust an analog gain based on the estimated received signal power; second estimation logic configured to estimate an adjusted signal power from an output of a digital filter while using the adjusted analog gain, wherein the output of the ADC is input to the digital filter; and second adjustment logic configured to adjust a digital gain based on the estimated adjusted signal power.

Certain embodiments of the present disclosure provide a computer-readable medium containing a program for AGC in a wireless communication system, which, when executed by a processor, performs certain operations. The operations generally include estimating power of a received signal from an output of an ADC; adjusting an analog gain based on the estimated received signal power; estimating an adjusted signal power from an output of a digital filter while using the adjusted analog gain, wherein the output of the ADC is input to the digital filter; and adjusting a digital gain based on the estimated adjusted signal power.

Certain embodiments of the present disclosure provide a method for DC calibration in a wireless communication system. The method generally includes setting an analog gain of a received signal to create an amplified signal, wherein the received signal is based on an OFDM or OFDMA frame; estimating a DC offset of the amplified signal during a gap time of the received signal; and applying the estimated DC offset to the amplified signal.

Certain embodiments of the present disclosure provide a receiver for wireless communication. The receiver generally includes gain setting logic configured to set an analog gain for a signal received by the receiver to create an amplified signal, wherein the received signal is based on an OFDM or OFDMA frame; offset estimation logic configured to estimate a DC offset of the amplified signal during a gap time of the received signal; and adjustment logic configured to apply the estimated DC offset to the amplified signal.

Certain embodiments of the present disclosure provide an apparatus for DC calibration in a wireless communication system. The apparatus generally includes means for setting an analog gain of a received signal to create an amplified signal, wherein the received signal is based on an OFDM or OFDMA frame; means for estimating a DC offset of the amplified signal during a gap time of the received signal; and means for applying the estimated DC offset to the amplified signal.

Certain embodiments of the present disclosure provide a mobile device. The mobile device generally includes a receiver front end for receiving a signal based on an OFDM or OFDMA frame; gain setting logic configured to set an analog gain for the received signal to create an amplified signal; estimation logic configured to estimate a DC offset of the amplified signal during a gap time of the received signal; and adjustment logic configured to apply the estimated DC offset to the amplified signal.

Certain embodiments of the present disclosure provide a computer-readable medium containing a program for DC calibration in a wireless communication system, which, when executed by a processor, performs certain operations. The operations generally include setting an analog gain of a received signal to create an amplified signal, wherein the received signal is based on an OFDM or OFDMA frame; estimating a DC offset of the amplified signal during a gap time of the received signal; and applying the estimated DC offset to the amplified signal.

BRIEF DESCRIPTION OF THE DRAWINGS

So that the manner in which the above recited features of the present disclosure can be understood in detail, a more particular description, briefly summarized above, may be had by reference to embodiments, some of which are illustrated in the appended drawings. It is to be noted, however, that the appended drawings illustrate only certain typical embodiments of this disclosure and are therefore not to be considered limiting of its scope, for the description may admit to other equally effective embodiments.

FIGS. 11A-11G illustrate signal power levels and DC offsets at various stages in the block diagram of FIG. 6B using the fast AGC based on CPs of FIG. 8 and the DC offset calibration of FIG. 10, in accordance with certain embodiments of the present disclosure.

DETAILED DESCRIPTION

Figure 1:
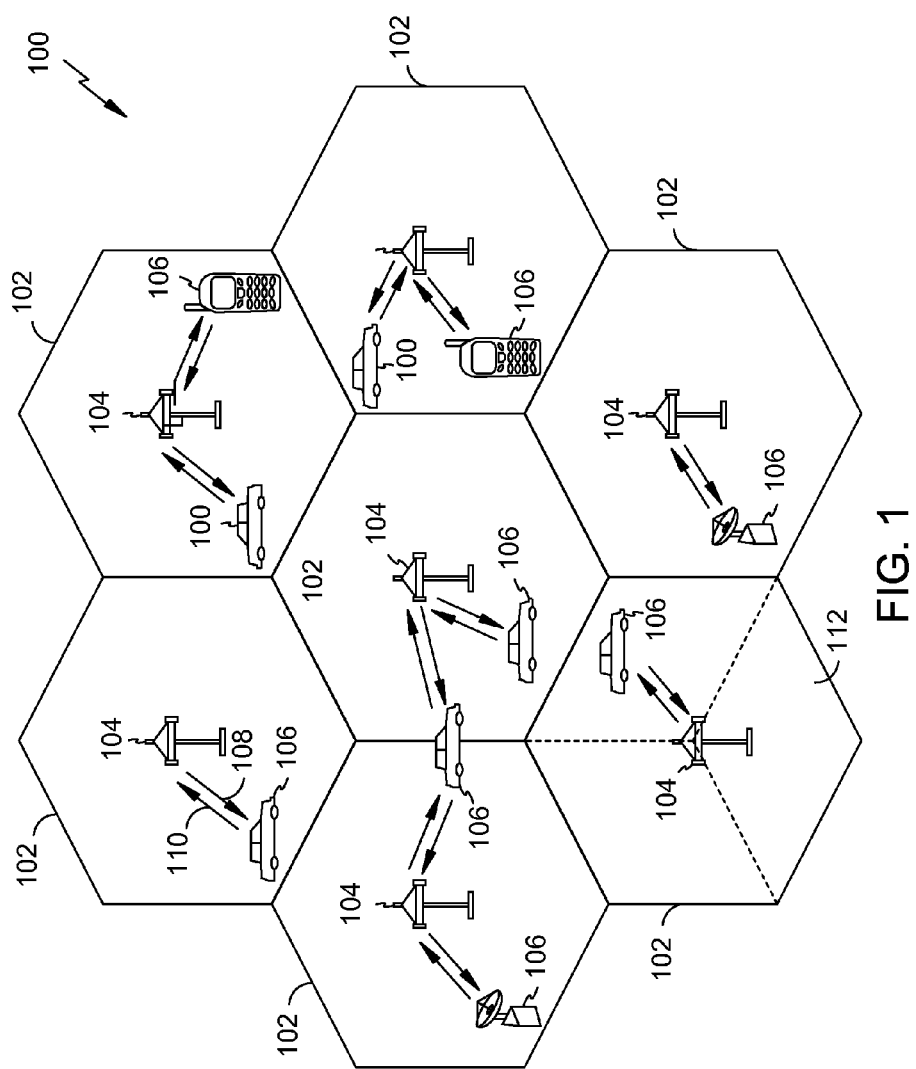
FIG. 1 illustrates an example wireless communication system, in accordance with certain embodiments of the present disclosure.

Certain embodiments of the present disclosure provide techniques and apparatus for automatic gain control (AGC) and DC calibration for orthogonal frequency-division multiplexing (OFDM) or orthogonal frequency division multiple access (OFDMA) systems in an effort to avoid saturation of the analog-to-digital converter (ADC) in a radio frequency (RF) front end of a receiver, especially in the presence of a large interference signal, to handle quickly changing received signal power, or to avoid interruptions in a communication link for DC calibration. For certain embodiments, the quantization error in the RF front end may also be decreased.

Exemplary Wireless Communication System

The methods and apparatus of the present disclosure may be utilized in a broadband wireless communication system. The term "broadband wireless" refers to technology that provides wireless, voice, Internet, and/or data network access over a given area.

WiMAX, which stands for the Worldwide Interoperability for Microwave Access, is a standards-based broadband wireless technology that provides high-throughput broadband connections over long distances. There are two main applications of WiMAX today: fixed WiMAX and mobile WiMAX. Fixed WiMAX applications are point-to-multipoint, enabling broadband access to homes and businesses, for example. Mobile WiMAX offers the full mobility of cellular networks at broadband speeds.

Mobile WiMAX is based on OFDM and OFDMA technology. OFDM is a digital multi-carrier modulation technique that has recently found wide adoption in a variety of high-data-rate communication systems. With OFDM, a transmit bit stream is divided into multiple lower-rate substreams. Each substream is modulated with one of multiple orthogonal subcarriers and sent over one of a plurality of parallel subchannels. OFDMA is a multiple access technique in which users are assigned subcarriers in different time slots. OFDMA is a flexible multiple-access technique that can accommodate many users with widely varying applications, data rates, and quality of service requirements.

The rapid growth in wireless internets and communications has led to an increasing demand for high data rate in the field of wireless communications services. OFDM/OFDMA systems are today regarded as one of the most promising research areas and as a key technology for the next generation of wireless communications. This is due to the fact that OFDM/OFDMA modulation schemes can provide many advantages such as modulation efficiency, spectrum efficiency, flexibility, and strong multipath immunity over conventional single carrier modulation schemes.

IEEE 802.16x is an emerging standard organization to define an air interface for fixed and mobile broadband wireless access (BWA) systems, such as for fixed BWA systems and for mobile BWA systems. These standards define at least four different physical layers (PHYs) and one media access control (MAC) layer. The OFDM and OFDMA physical layer of the four physical layers are the most popular in the fixed and mobile BWA areas respectively.

FIG. 1 illustrates an example of a wireless communication system 100. The wireless communication system 100 may be a broadband wireless communication system. The wireless communication system 100 may provide communication for a number of cells 102, each of which is serviced by a base station 104. A base station 104 may be a fixed station that communicates with user terminals 106. The base station 104 may alternatively be referred to as an access point, a Node B, or some other terminology.

FIG. 1 depicts various user terminals 106 dispersed throughout the system 100. The user terminals 106 may be fixed (i.e., stationary) or mobile. The user terminals 106 may alternatively be referred to as remote stations, access terminals, terminals, subscriber units, mobile stations, stations, user equipment, etc. The user terminals 106 may be wireless devices, such as cellular phones, personal digital assistants (PDAs), handheld devices, wireless modems, laptop computers, personal computers (PCs), etc.

A variety of algorithms and methods may be used for transmissions in the wireless communication system 100 between the base stations 104 and the user terminals 106. For example, signals may be sent and received between the base stations 104 and the user terminals 106 in accordance with OFDM/OFDMA techniques. If this is the case, the wireless communication system 100 may be referred to as an OFDM/OFDMA system.

A communication link that facilitates transmission from a base station 104 to a user terminal 106 may be referred to as a downlink 108, and a communication link that facilitates transmission from a user terminal 106 to a base station 104 may be referred to as an uplink 110. Alternatively, a downlink 108 may be referred to as a forward link or a forward channel, and an uplink 110 may be referred to as a reverse link or a reverse channel.

A cell 102 may be divided into multiple sectors 112. A sector 112 is a physical coverage area within a cell 102. Base stations 104 within a wireless communication system 100 may utilize antennas that concentrate the flow of power within a particular sector 112 of the cell 102. Such antennas may be referred to as directional antennas.

Figure 2:
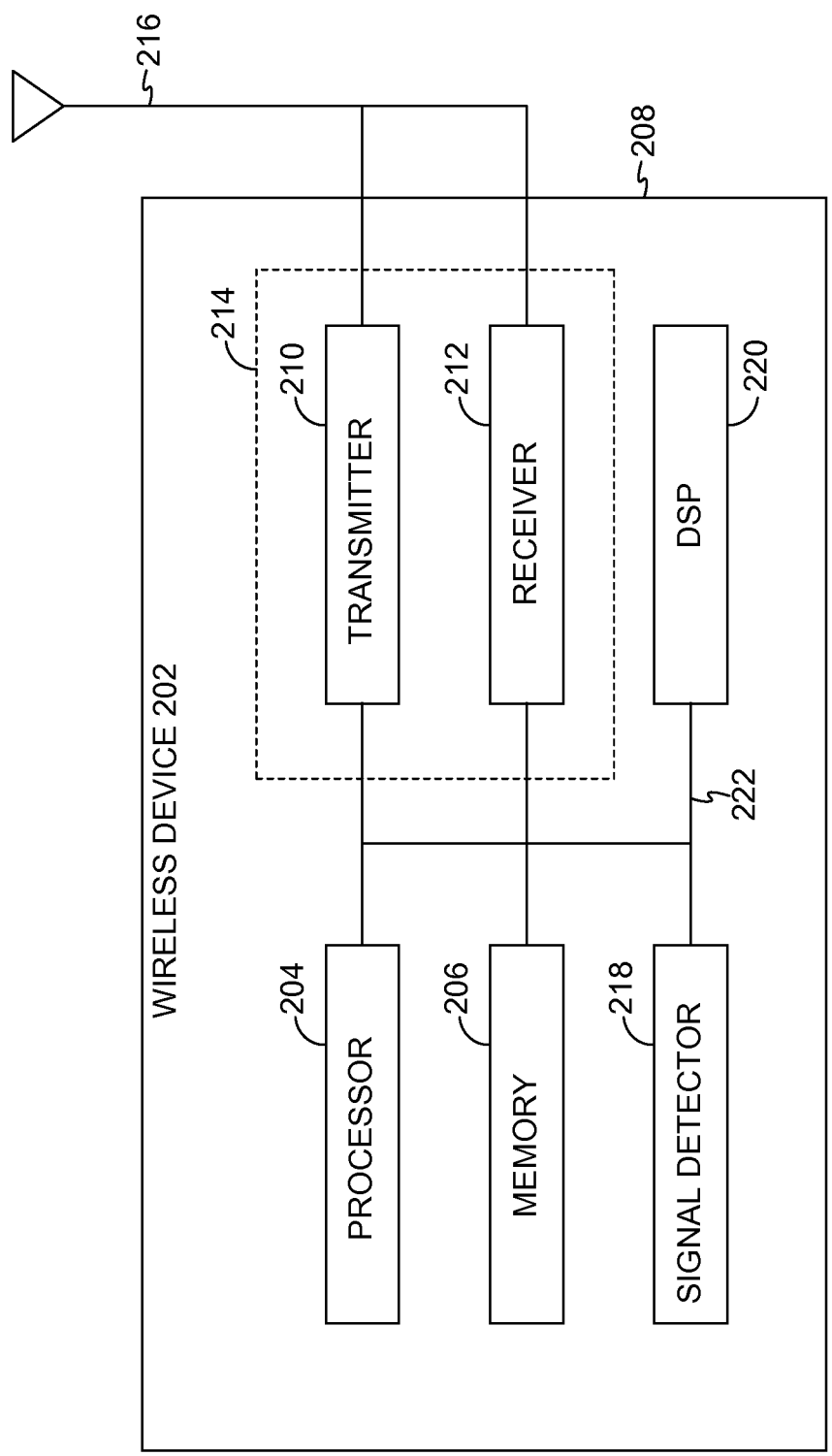
FIG. 2 illustrates various components that may be utilized in a wireless device, in accordance with certain embodiments of the present disclosure.

FIG. 2 illustrates various components that may be utilized in a wireless device 202. The wireless device 202 is an example of a device that may be configured to implement the various methods described herein. The wireless device 202 may be a base station 104 or a user terminal 106.

The wireless device 202 may include a processor 204 which controls operation of the wireless device 202. The processor 204 may also be referred to as a central processing unit (CPU). Memory 206, which may include both read-only memory (ROM) and random access memory (RAM), provides instructions and data to the processor 204. A portion of the memory 206 may also include non-volatile random access memory (NVRAM). The processor 204 typically performs logical and arithmetic operations based on program instructions stored within the memory 206. The instructions in the memory 206 may be executable to implement the methods described herein.

The wireless device 202 may also include a housing 208 that may include a transmitter 210 and a receiver 212 to allow transmission and reception of data between the wireless device 202 and a remote location. The transmitter 210 and receiver 212 may be combined into a transceiver 214. An antenna 216 may be attached to the housing 208 and electrically coupled to the transceiver 214. The wireless device 202 may also include (not shown) multiple transmitters, multiple receivers, multiple transceivers, and/or multiple antennas.

The wireless device 202 may also include a signal detector 218 that may be used in an effort to detect and quantify the level of signals received by the transceiver 214. The signal detector 218 may detect such signals as total energy, pilot energy from pilot subcarriers or signal energy from the preamble symbol, power spectral density, and other signals. The wireless device 202 may also include a digital signal processor (DSP) 220 for use in processing signals.

The various components of the wireless device 202 may be coupled together by a bus system 222, which may include a power bus, a control signal bus, and a status signal bus in addition to a data bus.

Figure 3:
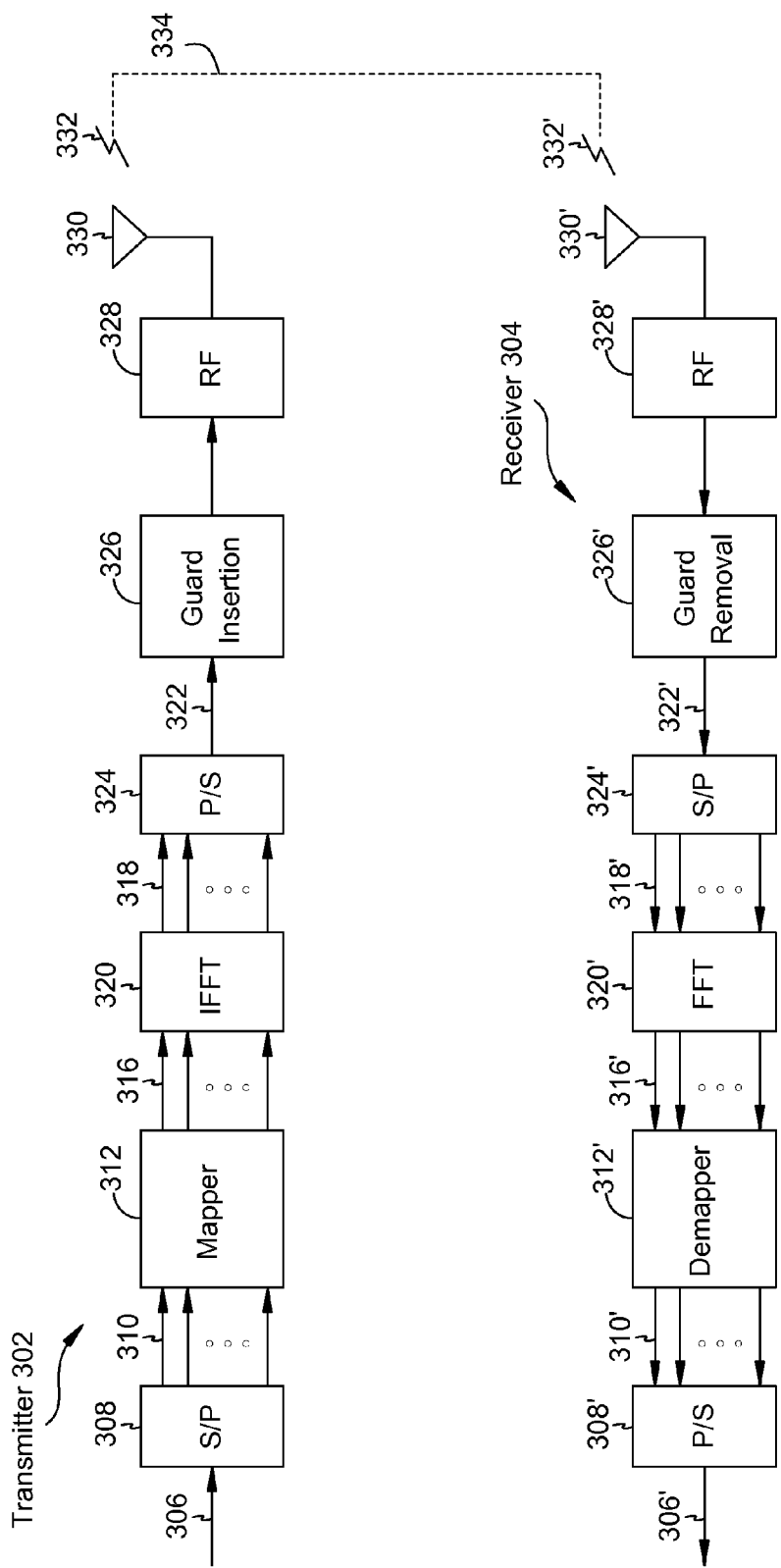
FIG. 3 illustrates an example transmitter and an example receiver that may be used within a wireless communication system that utilizes orthogonal frequency-division multiplexing and orthogonal frequency division multiple access (OFDM/OFDMA) technology, in accordance with certain embodiments of the present disclosure.

FIG. 3 illustrates an example of a transmitter 302 that may be used within a wireless communication system 100 that utilizes OFDM/OFDMA. Portions of the transmitter 302 may be implemented in the transmitter 210 of a wireless device 202. The transmitter 302 may be implemented in a base station 104 for transmitting data 306 to a user terminal 106 on a downlink 108. The transmitter 302 may also be implemented in a user terminal 106 for transmitting data 306 to a base station 104 on an uplink 110.

Data 306 to be transmitted is shown being provided as input to a serial-to-parallel (S/P) converter 308. The S/P converter 308 may split the transmission data into N parallel data streams 310.

The N parallel data streams 310 may then be provided as input to a mapper 312. The mapper 312 may map the N parallel data streams 310 onto N constellation points. The mapping may be done using some modulation constellation, such as binary phase-shift keying (BPSK), quadrature phase-shift keying (QPSK), 8 phase-shift keying (8PSK), quadrature amplitude modulation (QAM), etc. Thus, the mapper 312 may output N parallel symbol streams 316, each symbol stream 316 corresponding to one of the N orthogonal subcarriers of the inverse fast Fourier transform (IFFT) 320. These N parallel symbol streams 316 are represented in the frequency domain and may be converted into N parallel time domain sample streams 318 by an IFFT component 320.

A brief note about terminology will now be provided. N parallel modulations in the frequency domain are equal to N modulation symbols in the frequency domain, which are equal to N mapping and N-point IFFT in the frequency domain, which is equal to one (useful) OFDM symbol in the time domain, which is equal to N samples in the time domain. One OFDM symbol in the time domain, $N_s$, is equal to $N_{cp}$ (the number of guard samples per OFDM symbol)+N (the number of useful samples per OFDM symbol).

The N parallel time domain sample streams 318 may be converted into an OFDM/OFDMA symbol stream 322 by a parallel-to-serial (P/S) converter 324. A guard insertion component 326 may insert a guard interval between successive OFDM/OFDMA symbols in the OFDM/OFDMA symbol stream 322. The output of the guard insertion component 326 may then be upconverted to a desired transmit frequency band by a radio frequency (RF) front end 328. An antenna 330 may then transmit the resulting signal 332.

FIG. 3 also illustrates an example of a receiver 304 that may be used within a wireless communication system 100 that utilizes OFDM/OFDMA. Portions of the receiver 304 may be implemented in the receiver 212 of a wireless device 202. The receiver 304 may be implemented in a user terminal 106 for receiving data 306 from a base station 104 on a downlink 108. The receiver 304 may also be implemented in a base station 104 for receiving data 306 from a user terminal 106 on an uplink 110.

The transmitted signal 332 is shown traveling over a wireless channel 334. When a signal 332' is received by an antenna 330', the received signal 332' may be downconverted to a baseband signal by an RF front end 328'. A guard removal component 326' may then remove the guard interval that was inserted between OFDM/OFDMA symbols by the guard insertion component 326.

The output of the guard removal component 326' may be provided to an S/P converter 324'. The S/P converter 324' may divide the OFDM/OFDMA symbol stream 322' into the N parallel time-domain symbol streams 318', each of which corresponds to one of the N orthogonal subcarriers. A fast Fourier transform (FFT) component 320' may convert the N parallel time-domain symbol streams 318' into the frequency domain and output N parallel frequency-domain symbol streams 316'.

A demapper 312' may perform the inverse of the symbol mapping operation that was performed by the mapper 312, thereby outputting N parallel data streams 310'. A P/S converter 308' may combine the N parallel data streams 310' into a single data stream 306'. Ideally, this data stream 306' corresponds to the data 306 that was provided as input to the transmitter 302.

Exemplary OFDMA Frame

Figure 4:
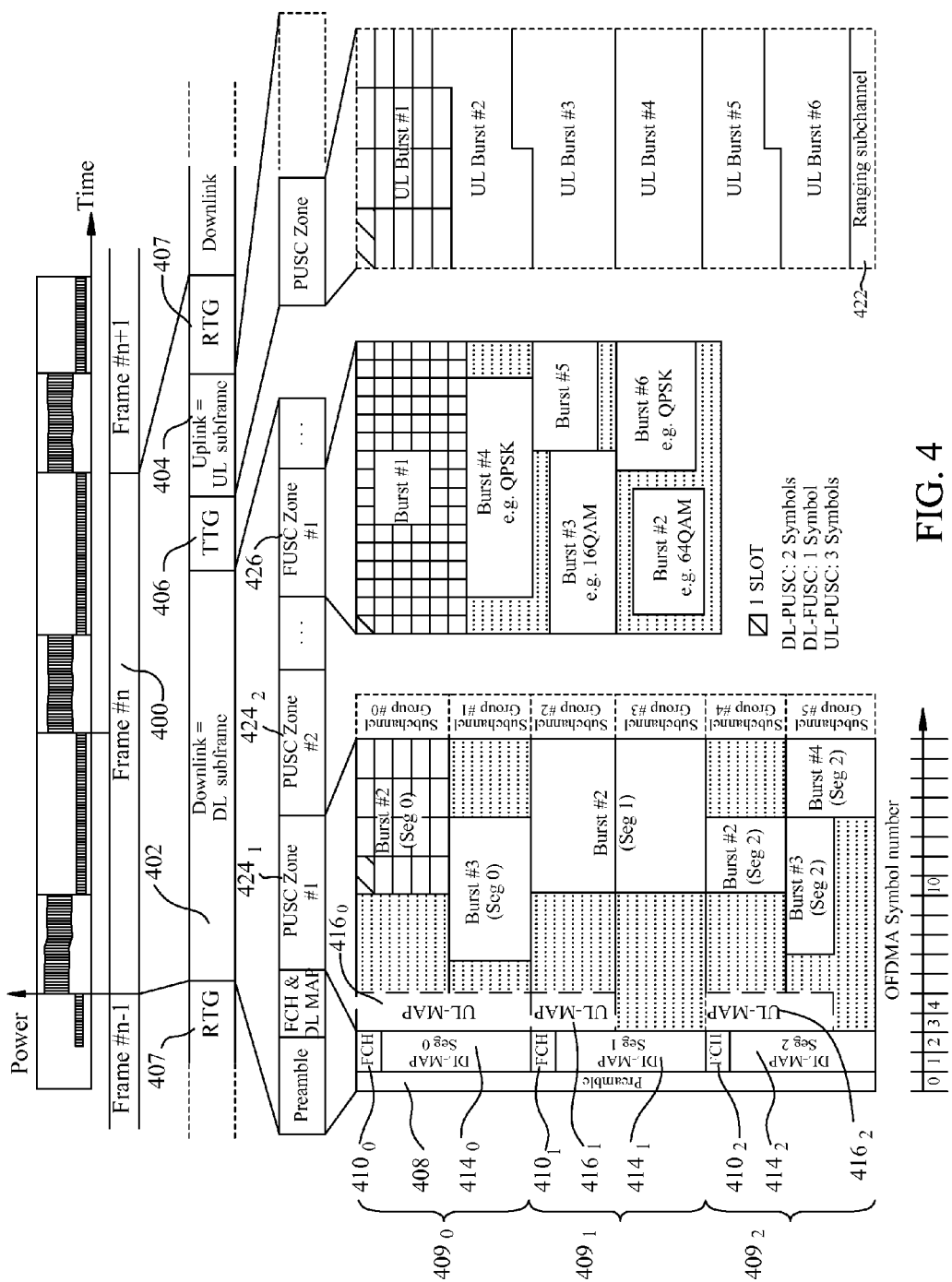
FIG. 4 illustrates an example OFDMA frame for Time-Division Duplex (TDD) with three segments, in accordance with certain embodiments of the present disclosure.

Referring now to FIG. 4, an OFDMA frame 400 for a Time-Division Duplex (TDD) implementation is depicted as a typical, but not limiting, example. Other implementations of an OFDMA frame, such as Full and Half-Duplex Frequency-Division Duplex (FDD) may be used, in which case the frame is the same except that both downlink (DL) and uplink (UL) messages are transmitted simultaneously over different carriers. In the TDD implementation, each frame may be divided into a DL subframe 402 and a UL subframe 404, which may be separated by a small guard interval—or, more specifically, by Transmit/Receive and Receive/Transmit Transition Gaps (TTG 406 and RTG 407, respectively)—in an effort to prevent DL and UL transmission collisions. The DL-to-UL-subframe ratio may be varied from 3:1 to 1:1 to support different traffic profiles.

Within the OFDMA frame 400, various control information may be included. For example, the first OFDMA symbol of the frame 400 may be a preamble 408, which may contain several pilot signals (pilots) used for synchronization. Fixed pilot sequences inside the preamble 408 may allow the receiver 304 to estimate frequency and phase errors and to synchronize to the transmitter 302. Moreover, fixed pilot sequences in the preamble 408 may be utilized to estimate and equalize wireless channels. The preamble 408 may contain BPSK-modulated carriers and is typically one OFDM symbol long. The carriers of the preamble 408 may be power boosted and are typically a few decibels (dB) (e.g., 9 dB) higher than the power level in the frequency domain of data portions in the WiMAX signal. The number of preamble carriers used may indicate which of the three segments 409 of the zone are used. For example, carriers 0, 3, 6, ... may indicate that segment 0 ($409_0$) is to be used, carriers 1, 4, 7, ... may indicate that segment 1 ($409_1$) is to be used, and carriers 2, 5, 8, ... may indicate that segment 2 ($409_2$) is to be used.

A Frame Control Header (FCH) 410 may follow the preamble 408, one FCH 410 per segment 409. The FCH 410 may provide frame configuration information, such as the usable subchannels, the modulation and coding scheme, and the MAP message length for the current OFDMA frame. A data structure, such as the downlink Frame Prefix (DLFP), outlining the frame configuration information may be mapped to the FCH 410. The DLFP for Mobile WiMAX may comprise a used subchannel (SCH) bitmap, a reserved bit set to 0, a repetition coding indication, a coding indication, a MAP message length, and four reserved bits set to 0. Before being mapped to the FCH 410, the 24-bit DLFP may be duplicated to form a 48-bit block, which is the minimal forward error correction (FEC) block size.

Following the FCH 410 in each segment 409, a DL-MAP 414 and a UL-MAP 416 may specify subchannel allocation and other control information for the DL and UL subframes 402, 404, respectively. In OFDMA, multiple users may be allocated data regions within the frame 400, and these allocations may be specified in the DL and UL-MAP 414, 416. The MAP messages may include the burst profile for each user, which defines the modulation and coding scheme used in a particular link. Since MAP messages contain critical information that needs to reach all users for that segment 409, the DL and UL-MAP 414, 416 may often be sent over a very reliable link, such as BPSK or QPSK with rate ½ coding and repetition coding.

The DL subframe 402 of the OFDMA frame 400 may include DL bursts of various bit lengths containing the downlink data being communicated. Thus, the DL-MAP 414 may describe the location of the bursts contained in the downlink zones and the number of downlink bursts, as well as their offsets and lengths in both the time (i.e., symbol) and the frequency (i.e., subchannel) directions. Altogether, the preamble 408, the FCH 410, and the DL-MAP 414 may carry information that enables the receiver 304 to correctly demodulate the received signal.

Likewise, the UL subframe 404 may include UL bursts of various bit lengths composed of the uplink data being communicated. Therefore, the UL-MAP 416, transmitted as the first DL burst in the DL subframe 402, may contain information about the location of the UL burst for different users. The UL subframe 404 may include additional control information as illustrated in FIG. 4, such as a UL Ranging subchannel 422 allocated for the mobile station to perform closed-loop time, frequency, and power adjustments during network entry and periodically afterward, as well as bandwidth requests. The UL subframe 404 may also include a UL ACK (not shown) allocated for the mobile station (MS) to feed back a DL hybrid automatic repeat request acknowledgment (HARQ ACK) and/or a UL CQICH (not shown) allocated for the MS to feed back channel state information on the Channel Quality Indicator channel (CQICH).

Different "modes" may be used for DL and UL transmission in OFDMA. An area in the time domain where a certain mode is used is generally referred to as a zone. One type of zone is called a DL-PUSC (downlink partial usage of subchannels) zone 424 and may not use all the subchannels available to it (i.e., a DL-PUSC zone 424 may only use particular subchannels). A DL-PUSC zone 424 may be divided into a total of six subchannel groups, which can be assigned to up to three segments 409. Thus, a segment 409 may contain one to six subchannel groups (e.g., segment 0 may contain two subchannel groups 0 and 1, segment 1 may contain two subchannel groups 2 and 3, and segment 2 may contain two subchannel groups 4 and 5 as illustrated in FIG. 4). Another type of zone is called a DL-FUSC (downlink full usage of subchannels) zone 426. Unlike DL-PUSC, DL-FUSC does not use any segments, but can distribute all bursts over the complete frequency range.

Figure 5:
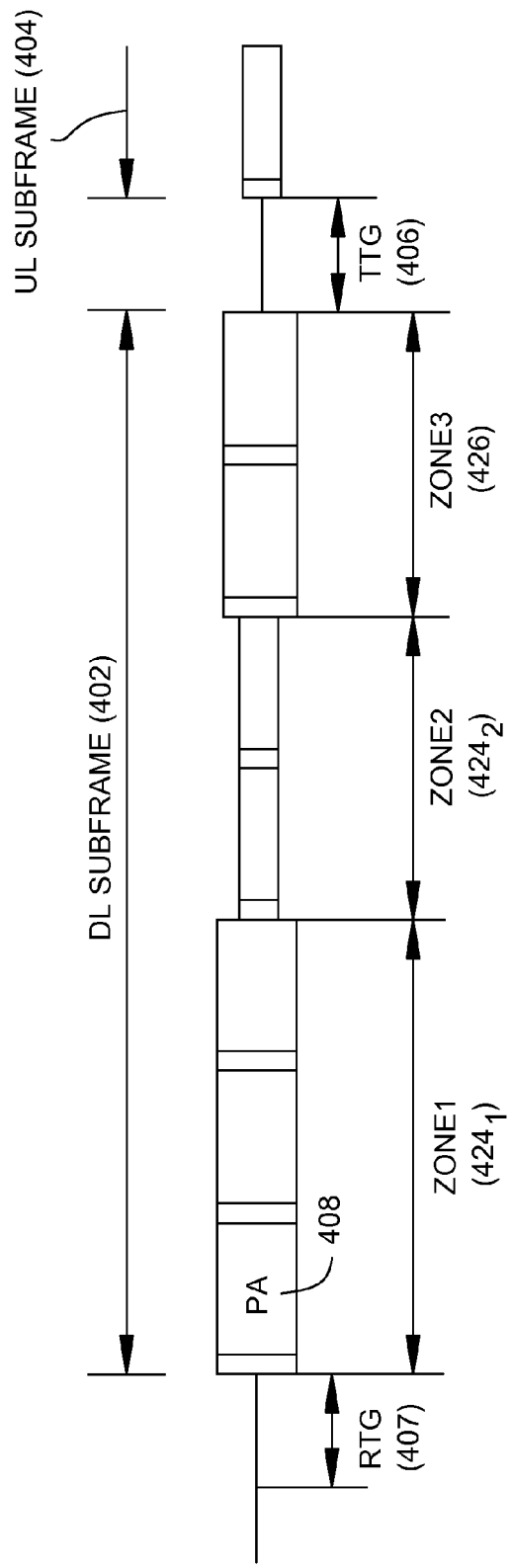
FIG. 5 illustrates an example of power variation in different OFDM/OFDMA zones within a downlink (DL) subframe, in accordance with certain embodiments of the present disclosure.

FIG. 5 illustrates that different OFDM/OFDMA zones within the DL subframe 402 may vary in signal power. For example, the first zone (ZONE 1) may be the first DL-PUSC zone $424_1$ and may have a greater signal power than the second zone (ZONE 2), which may be the second DL-PUSC zone $424_2$ as depicted. As another example, the third zone (ZONE 3) may be a DL-FUSC zone 426 and may also have a greater signal power than ZONE 2 as shown.

Exemplary Method for Automatic Gain Control (AGC)

Figure 6A:
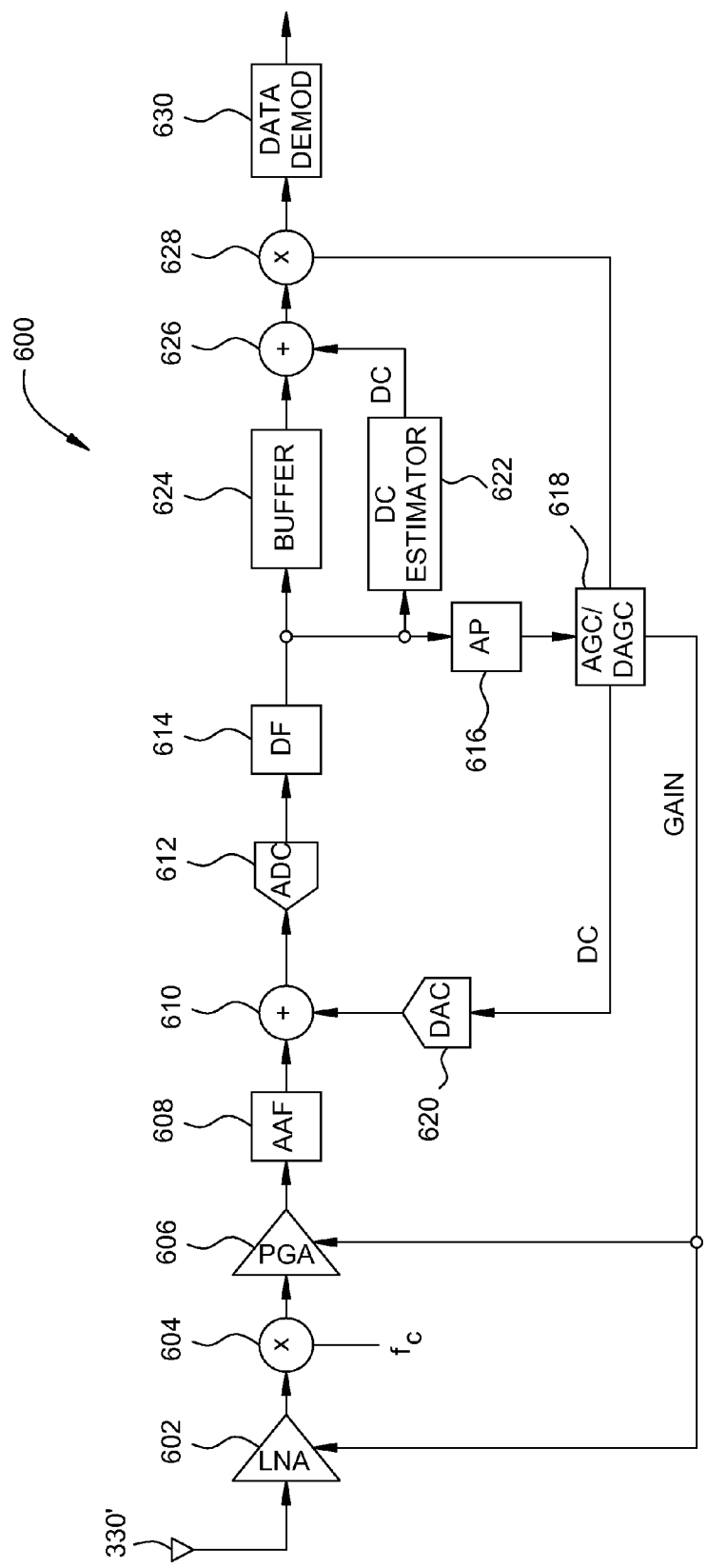
FIGS. 6A and 6B illustrate block diagrams of a radio frequency (RF) front end of a receiver within a wireless communication system that may utilize OFDM/OFDMA, in accordance with certain embodiments of the present disclosure.

FIG. 6A illustrates a block diagram 600 of a zero intermediate frequency (ZIF) architecture as one example of an RF front end 328' for a receiver 304. In the block diagram 600, the antenna 330' may be coupled to a low noise amplifier (LNA) 602. The LNA 602 may be used to provide a high degree of signal gain (e.g., 0, 20, 40, or 60 dB) without introducing significant noise or spurious signal components to the amplified signal. By having a programmable gain, the LNA 602 may provide a coarse gain adjustment with a resolution of 20 dB, for example, for automatic gain control (AGC).

The LNA 602 may be coupled to a mixer 604 in an effort to mix an output of the LNA 602 with a local oscillator frequency operating at a predetermined frequency ($f_c$). Although not shown in FIG. 6A, those skilled in the art will recognize that the amplified signal may be separated into in-phase (I) and quadrature (Q) signals at the mixer 604, and subsequent signal processing may be applied to both the I and Q signals. For simplicity, the diagram 600 illustrates only one of the signal processing paths following the mixer 604.

The mixed signal may be amplified by a programmable gain amplifier (PGA) 606 in an effort to provide fine gain adjustment compared to the coarse adjustment of the LNA 602. For example, the PGA 606 may provide a fine gain adjustment with a resolution of 1 dB. The PGA 606 may be coupled to an anti-aliasing filter (AAF) 608 in an effort to remove out-of-band high frequency components of the amplified signal before they are aliased into the passband by digital sampling. The AAF 608 may be coupled to a summer 610 for removing a DC offset before the resulting signal is converted to the digital domain for digital signal processing by an analog-to-digital converter (ADC) 612. The ADC 612 may have a high resolution, such as 16-bits.

The ADC 612 may be coupled to a digital filter (DF) 614 in an effort to remove components from out-of-band frequencies. The average power (AP) of the digital output of the DF 614 may be estimated by the AP block 616 and sent to an automatic gain control (AGC)/digital automatic gain control (DAGC) block 618 for processing. The AGC/DAGC block 618 may send digital control signals to the LNA 602 and/or the PGA 606 to adjust the variable gain of these stages based on the estimated signal power from the AP block 616. Furthermore, the AGC/DAGC block 618 may send a digital DC offset to be converted to an analog DC offset by a digital-to-analog converter (DAC) 620. The output of the DAC 620 may be summed with the output of the AAF 608 by the summer 610.

A DC estimator 622 and a buffer 624 may also be coupled to the output of the DF 614. The DC estimator 622 may be used to estimate any residual DC offset in the signal output by the DF 614, and the buffer 624 may hold this signal such that the residual DC offset may be subtracted from the buffered signal by a summer 626. The same signal power from the AP block 616 may be used by the AGC/DAGC block 618 to perform automatic gain control in the digital domain by multiplying the output of the summer 626 with a control signal from the AGC/DAGC block 618 using multiplier 628. The resulting signal may be further processed in a data demodulator 630 in an effort to interpret the message in the signal received at the antenna 330'.

One problem with the block diagram 600 of FIG. 6 lies in estimating the signal power with the AP block 616 after the digital filter 614 has potentially removed out-of-band interference signals, especially high amplitude interference signals. In this manner, the programmable gain of the LNA 602 and/or the PGA 606 may be set too high, and a large interferer may rail one or both of the amplifiers and saturate the output of the ADC 612.

One way to solve this might be to estimate the signal power at the output of the ADC 612 rather than at the output of the digital filter 614. However, because the block diagram 600 of FIG. 6 uses the same signal power estimate for both analog and digital automatic gain control in the AGC/DAGC block 618, estimates of the signal power that included the large interference signal would not be correct for automatic gain control in the digital domain after the digital filter 614 has removed the out-of-band frequencies. Accordingly, what is needed is a new ZIF architecture for automatic gain control.

Figure 6B:
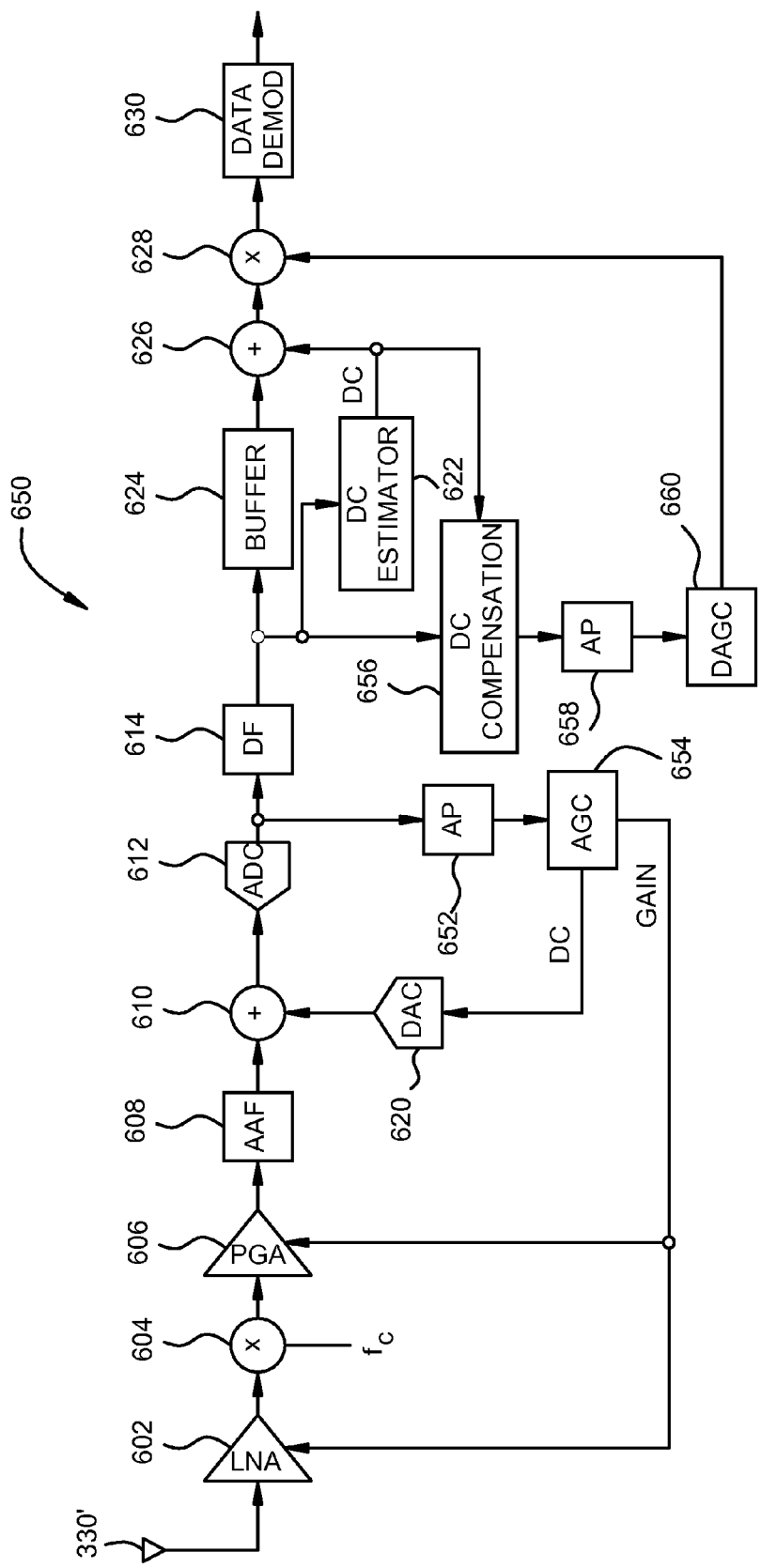

FIG. 6B illustrates a block diagram 650 of a ZIF architecture for an RF front end 328' configured to perform AGC without saturating the ADC output and to conduct a separate DAGC in an effort to reduce the quantization error. To accomplish these design goals, the ZIF architecture may contain two separate AP blocks 652, 658 for estimating signal power. The first AP block 652 may estimate the average power of the output of the ADC 612 before the output is filtered by the digital filter 614, and thus, the power estimate may include out-of-band signal components, such as large interference signals. A separate AGC block 654 may provide control signals for programming the gain of the LNA 602 and/or the PGA 606 based on the estimated signal power from the first AP block 652, as well as for DC offset as described above. In this manner, the gain set by the AGC block 654 may adjust for the amplitude (or, more correctly stated, the power) of signals received in the first few stages of the RF front end 328' in an effort to avoid saturating the ADC 612.

For automatic gain control based on signal power, an estimate of the signal power should not include a DC offset error. Therefore, before the second AP block 658 estimates the signal power from the output of the digital filter 614, a DC compensator 656, when activated, may remove a DC estimate from an input signal from the digital filter 614 and send the resulting signal to the second AP block 658. The DC estimate may be supplied by the DC estimator 622 as described above. For some embodiments, the DC compensator 656 may not be present. In such cases, the DC compensator 656 as shown may be considered as having a short from its first input from the DF 614 to its output where the second input from the DC estimator 622 is ignored.

After the digital filter 614 has removed out-of-band components from the output of the ADC 612 (and DC compensation has occurred for some embodiments, courtesy of the DC compensator 656), the second AP block 658 may estimate the average power of the signal. A separate DAGC block 660 may output a digital control signal or value based on the estimated power, and this control signal may be multiplied with the output of the summer 626 by the multiplier 628 in an effort to perform automatic gain control in the digital domain. In this manner, DAGC may be correctly performed based on the signal content in the digital domain, and the quantization error may be reduced.

Figure 7:
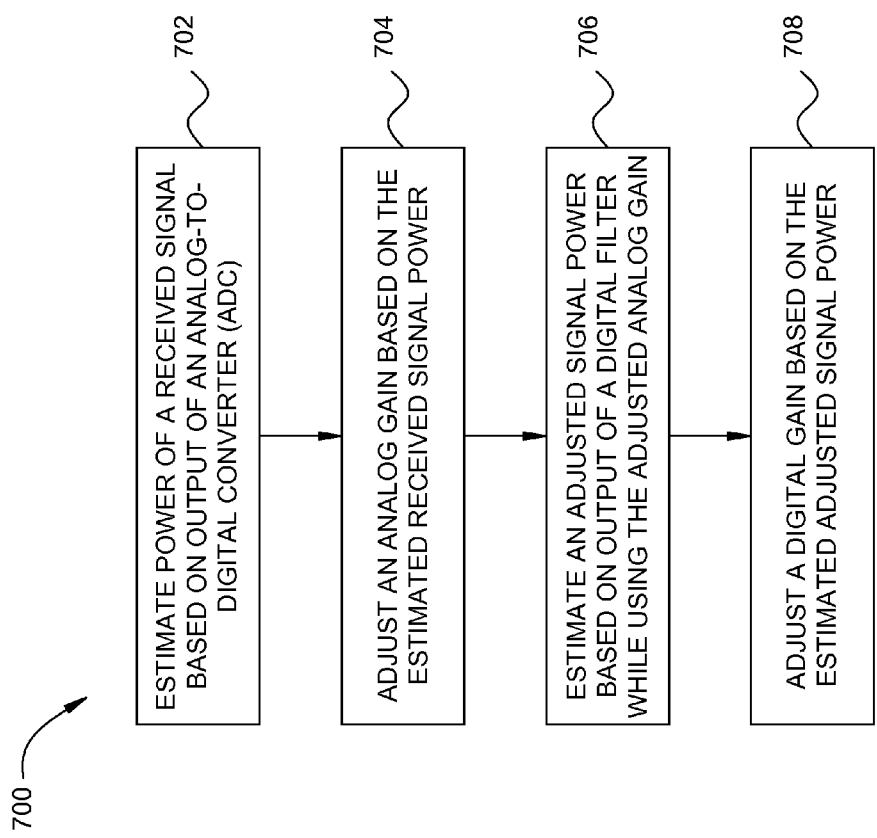
FIG. 7 is a flow chart of example operations for automatic gain control (AGC) of both the analog and digital gain blocks of FIG. 6B, in accordance with certain embodiments of the present disclosure.

FIG. 7 is a flow chart of example operations 700 for automatic gain control according to the block diagram 650 of FIG. 6B, for example. The operations 700 may begin, at 702, by estimating the signal power of an output of an ADC (e.g., ADC 612) with the first AP block 652, for example, after a received signal has been signal processed (e.g., amplified, mixed, low-pass filtered, DC compensated, etc.) and input to the ADC. The output of the ADC may most likely not be digitally filtered or otherwise digitally signal processed before estimating the signal power at 702. At 704, the analog gain may be adjusted based on the estimated received signal power. In this manner, the signal content with potentially large interference signals may be used to automatically adjust the gain of the variable gain amplifiers (e.g., LNA 602 and/or the PGA 606) without running the risk of saturating the ADC.

At 706, the signal power of the output of a digital filter (e.g., DF 614) may be estimated by the second AP block 658, for example, while employing the analog gain set in 704. The input of the digital filter may be coupled to the output of the ADC for some embodiments. At 708, a digital gain based on the estimated adjusted signal power may be adjusted.

Exemplary Method for Fast AGC using Cyclic Prefixes

Although the block diagram 650 of FIG. 6B and the operations 700 of FIG. 7 may address the problem of saturating the ADC while maintaining analog and digital AGC, there may be other problems associated with AGC. For example, the power of the received signal may be changing quickly in a mobile environment, especially with a user terminal 106 in a fast-moving vehicle. Existing methods for AGC may use the signal power of the previous OFDM/OFDMA frame to control the receiver gain for the current frame signal. However, this method may be too slow to track the received signal power variation due to fading with a fast-moving user terminal, and the performance may suffer. Accordingly, what is needed is a faster method of AGC.

Figure 8:
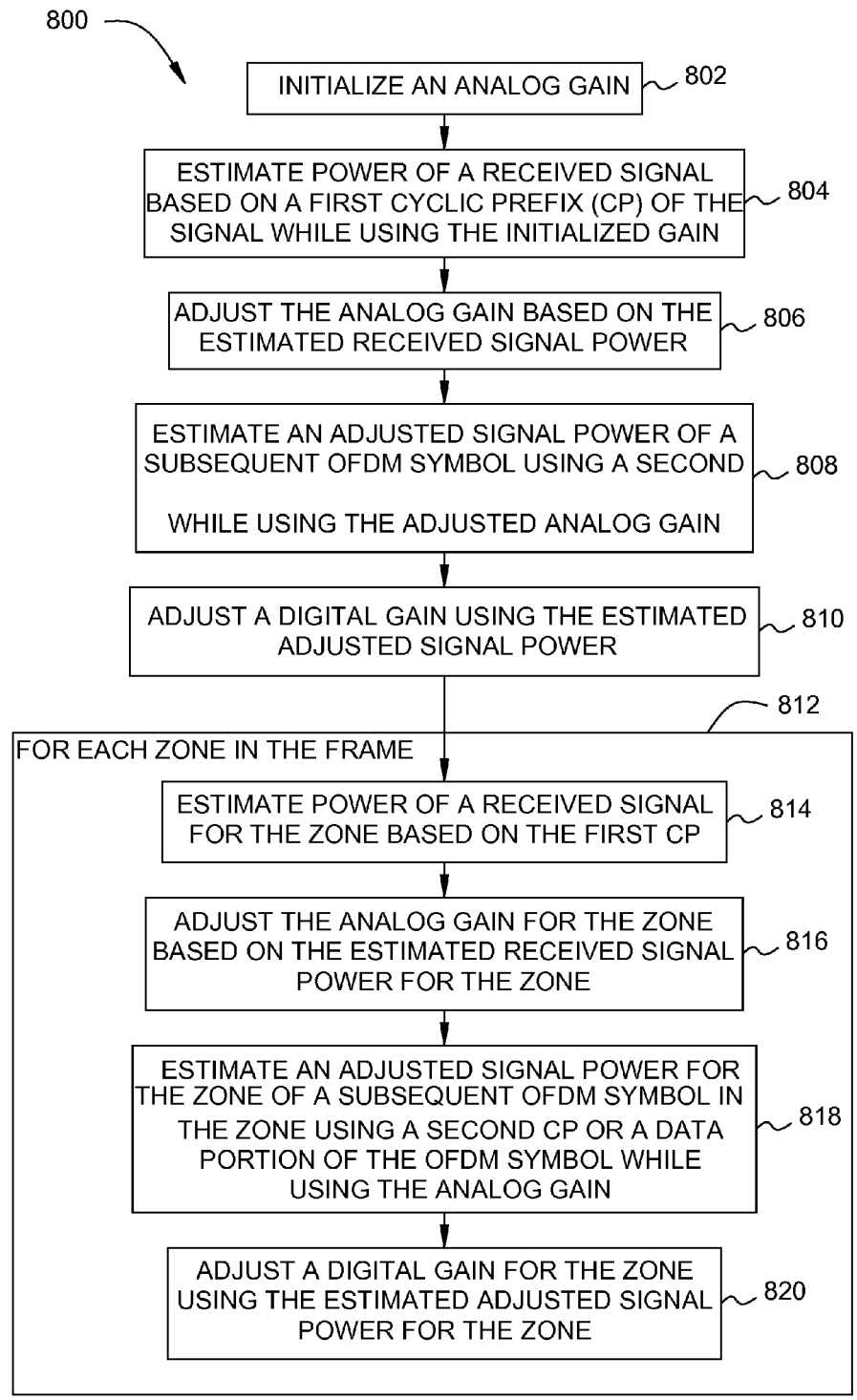
FIG. 8 is a flow chart of example operations for fast AGC using cyclic prefixes (CPs) of OFDM/OFDMA symbols, in accordance with certain embodiments of the present disclosure.
Figure 8A:
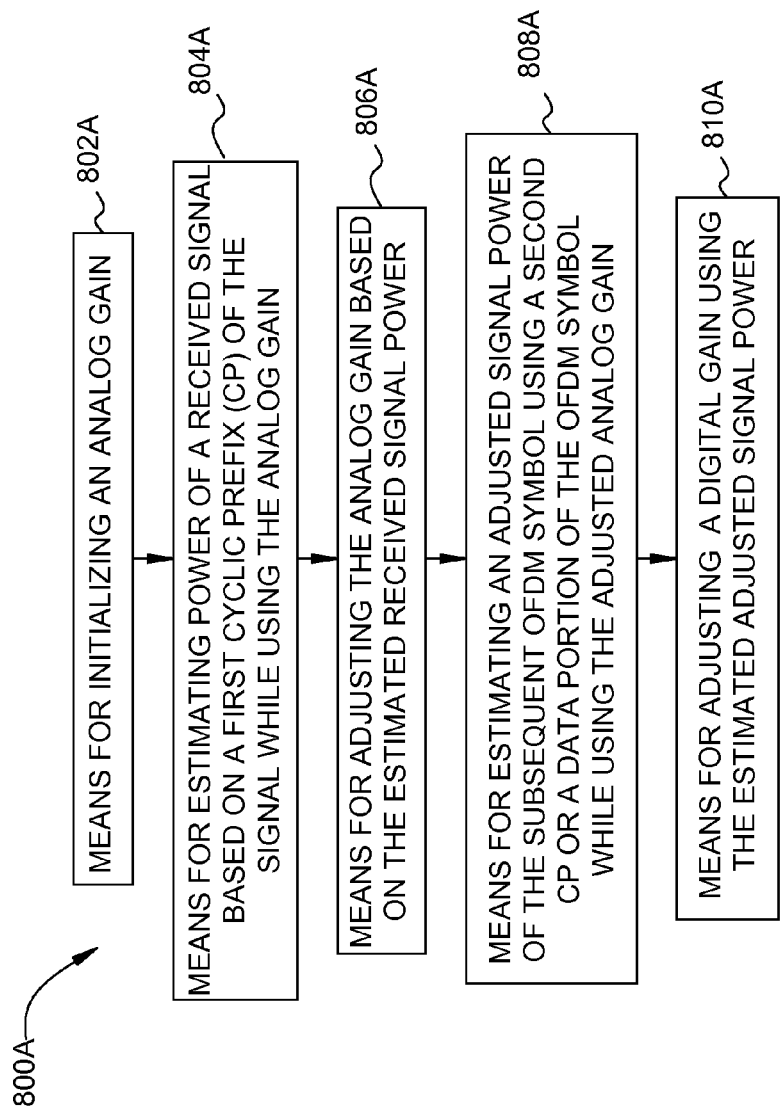
FIG. 8A is a block diagram of means corresponding to the example operations for fast AGC using CPs of FIG. 8, in accordance with certain embodiments of the present disclosure.

FIG. 8 is a flow chart of example operations 800 for fast AGC using cyclic prefixes (CPs) of OFDM/OFDMA symbols. The operations 800 may work in conjunction with the block diagram 650 of FIG. 6B, for example. The operations 800 may begin, at 802, by initializing an analog gain for the current OFDM/OFDMA frame. For example, the initial gain of the LNA 602 and/or the PGA 606 may be set based on the signal power of the previous OFDM/OFDMA frame. The gain may be set by using control signals from the AGC block 654.

At 804, the signal power of a received signal amplified with the initial gain may be estimated based on a cyclic prefix (CP) of the signal. To estimate the received signal power, the output of an ADC (e.g., ADC 612) may be sent to an AP block (e.g. as the first AP block 652) after the received signal has been signal processed (e.g., amplified according to the initial gain, mixed, low-pass filtered, DC compensated, etc.) and input to the ADC, similar to 702 of FIG. 7. At 806, the analog gain (e.g., the gain of the LNA 602 and/or the PGA 606) may be adjusted based on the estimated received signal power.

Figure 9:
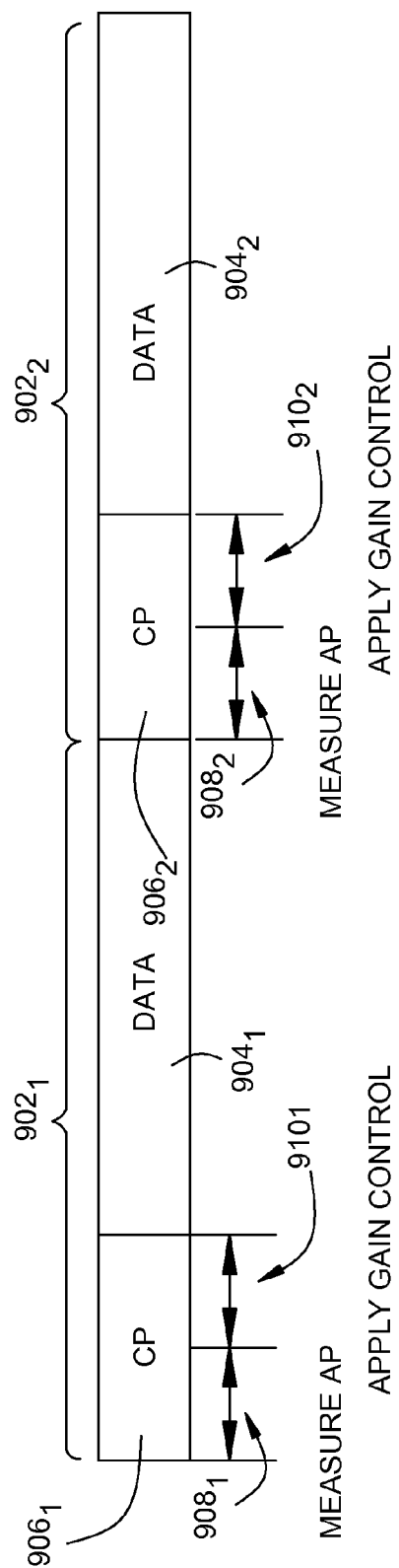
FIG. 9 illustrates measuring power of and applying automatic gain control during a CP of an OFDM/OFDMA symbol, in accordance with certain embodiments of the present disclosure.

FIG. 9 illustrates two OFDM/OFDMA symbols 902 of an OFDM/OFDMA frame, where a latter portion of the data 904 of each symbol 902 has been prefixed to the data 904 to form a cyclic prefix (CP) 906, also known as a guard period (GP). With CPs 906, a receiver 304 is able to receive a signal traveling along several different delay paths for a longer time and demodulate the signal without any errors due to intersymbol interference (ISI). A typical OFDM system supports several CP lengths; for example, a WiMAX system supports four different CP lengths: N/4, N/8, N/16, and N/32 where N is FFT size. The CP length may be predetermined for a specific system profile such that a mobile station (MS) can easily determine the CP length by referring to the system profile. In certain systems where the CP length is not predetermined, the CP length may be estimated by the MS during the acquisition process.

When a signal based on an OFDM/OFDMA frame is received, the average power may be estimated during the first part 908 of the CP 906 at 804, for example. The analog gain may be adjusted during the second part 910 of the CP 906 at 806, for example. In this manner, by the time the data 904 is to be read, the analog gain may have been automatically adjusted to a proper level based on the CP 906, and the data 904 of each symbol 902 may be interpreted with a proper gain.

Referring back to FIG. 8, the signal power of a subsequent OFDM/OFDMA symbol in the current zone may be estimated according to the CP 906 or the data 904 within that symbol at 808. The received signal for the subsequent symbol may most likely be amplified by the adjusted analog gain from 806. The second AP block 658 may be used to estimate the adjusted signal power. At 810, the digital gain may be adjusted based on the estimated adjusted signal power from 808. For example, the digital gain may be adjusted by multiplying an output of the DAGC block 660 based on the estimated adjusted signal power from the second AP block 658 using the multiplier 628.

In this manner, the RF front end 328' may perform fast automatic gain control for the receiver 304 based on the cyclic prefix of OFDM/OFDMA symbols. Blocks 804 through 810 may be repeated to update the AGC and/or DAGC, based on the previous analog gain rather than initializing the analog gain for block 804. For some embodiments, AGC and/or DAGC may be updated every CP, while in other embodiments, the analog gain and/or digital gain may be updated every 2 CPs, every 3 CPs, every 4 CPs, etc. The update interval may depend on the speed of the user terminal 106: a faster-moving user terminal may suggest a shorter update interval than a fixed user terminal or one that is moving relatively slowly. For some embodiments, the AGC and the DAGC need not be updated at the same CP interval.

For some embodiments, multiple CPs may be evaluated at 804 and/or at 808 before an adjustment decision is made at 806 and/or at 810, respectively. For example, the estimated signal power of multiple CPs may be averaged rather than estimating the signal power for a single CP of an OFDM/OFDMA symbol. In the case of averaged signal powers based on multiple CPs, a running average may be performed. For other embodiments, median filtering may be performed on the estimated signal power of multiple CPs, discarding values that are a predetermined statistical difference away from the median sample. Various other types of statistical algorithms may be employed to determine an accurate estimate of signal power based on multiple CPs for fast AGC.

Whatever AGC update interval is selected, different OFDM/OFDMA zones within the DL subframe 402 may vary in signal power as illustrated in FIG. 5, independent of the velocity of a mobile user terminal. Therefore, fast AGC based on CPs may most likely be conducted at the start of each different zone (e.g., each DL-PUSC zone 424 or DL-FUSC zone 426) within a DL subframe 402 in an effort to update the analog and digital gains.

Referring back to FIG. 8, for each different zone in the frame at 812, the signal power of a received signal for the zone may be estimated based on a CP for that zone, typically on the first CP of the zone, at 814. This signal power may be estimated in a similar manner as the power estimation at 804. At 816, the analog gain (e.g., the gain of the LNA 602 and/or the PGA 606) for the zone may be adjusted based on the estimated received signal power from 814, similar to the adjustment at 806.

At 818, the signal power of a subsequent OFDM/OFDMA symbol in the current zone may be estimated according to the CP 906 or the data 904 within that symbol. The received signal for the subsequent symbol may most likely be amplified by the adjusted analog gain from 816. This signal power may be estimated in a similar manner as the power estimation at 808. At 820, the digital gain may be adjusted based on the estimated adjusted signal power from 818, similar to the digital gain adjustment at 810. For example, the digital gain may be adjusted by multiplying an output of the DAGC block 660 based on the estimated adjusted signal power from the second AP block 658 using the multiplier 628.

In this manner, the RF front end 328' may perform fast automatic gain control for each zone of an OFDM/OFDMA frame based on the cyclic prefix of OFDM/OFDMA symbols. Blocks 814 through 820 may be repeated to update the AGC and/or DAGC within the current zone. As described above, AGC and/or DAGC may be updated based on CPs within the current zone at various intervals.

Exemplary Method for DC Calibration

Not only can large interference signals cause saturation of the ADC in the RF front end 328' of a receiver 304 as described above, but a DC signal may also be responsible for saturating an ADC, such as the ADC 612 of FIGS. 6A and 6B. Therefore, the DC offset may be calibrated in an effort to avoid saturating the ADC, and conventionally, DC calibration has been performed during the initialization stage for the user terminal 106. However, because the DC offset may shift due to temperature variation or the Doppler effect for a moving user terminal, DC calibration may need to be performed more frequently, perhaps during communication exchanges between the base station 104 and the user terminal 106. Typically, a receiver 304 cannot operate during DC calibration, so the communication link is stopped temporarily to update the DC offset, potentially interrupting real-time services such as VoIP (voice over Internet Protocol) and VOD (video on demand). Accordingly, what is needed is a method of updating the DC offset without interrupting a communication link or causing the link to fail.

Figure 10:
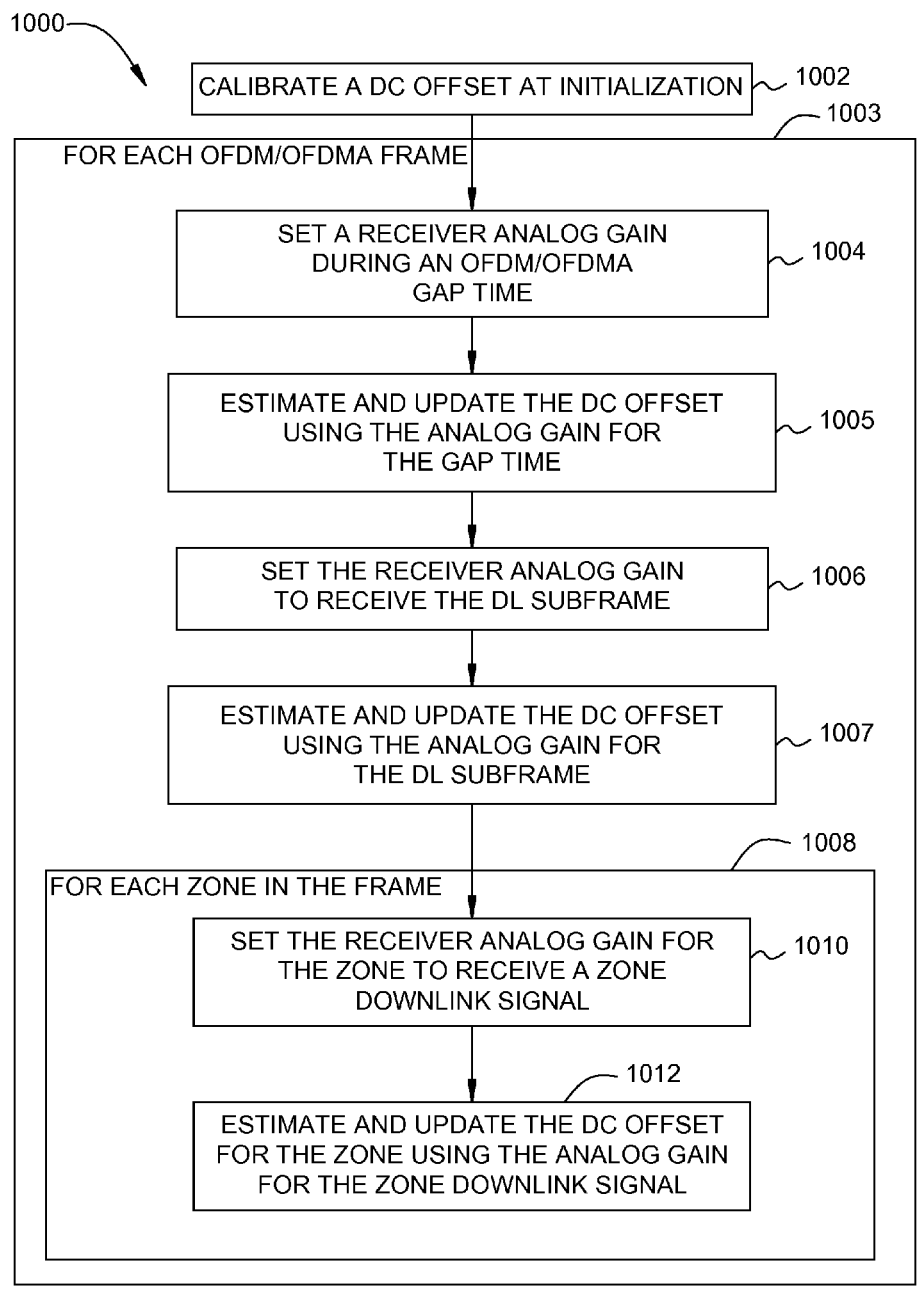
FIG. 10 illustrates a flow diagram of example operations for DC offset calibration, in accordance with certain embodiments of the present disclosure.
Figure 10A:
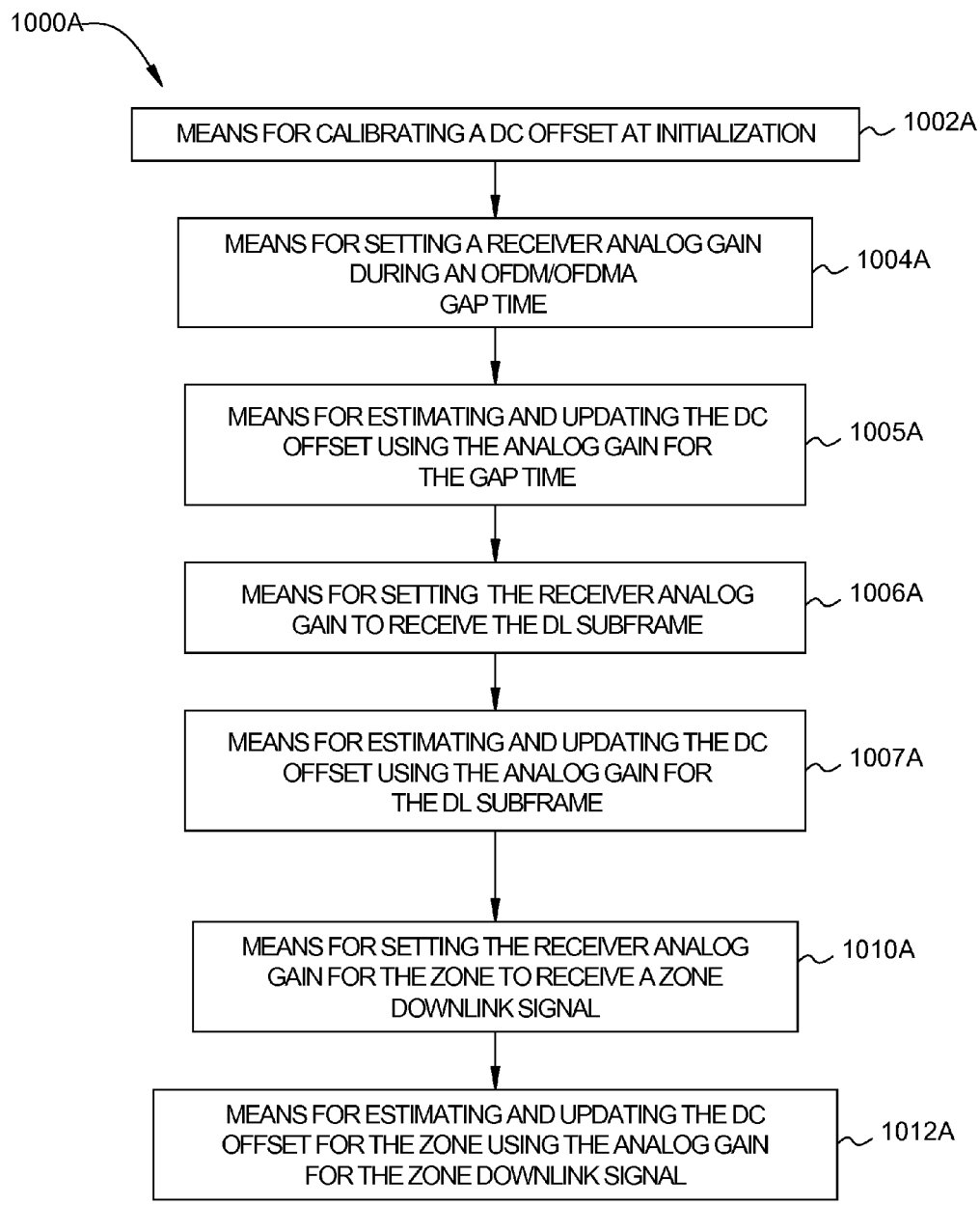
FIG. 10A is a block diagram of means corresponding to the example operations for the DC offset calibration of FIG. 10, in accordance with certain embodiments of the present disclosure.

FIG. 10 is a flow chart of example operations 1000 for DC offset calibration without stopping a communication link. The operations 1000 may begin, at 1002, by calibrating a DC offset during the initialization stage for the user terminal 106. This initial DC offset calibration may be performed in any suitable manner known by those of skill in the art.

For each OFDM/OFDMA frame for normal traffic exchange at 1003, the analog gain for the RF front end 328' of the receiver 304 may be set during a gap time, such as the Receive/Transmit Transition Gap (RTG) 407 before the DL subframe 402, at 1004. For example, the gain of the LNA 602 and/or the PGA 606 may be set during the RTG 407 to any suitable value in an effort to estimate the DC offset. At 1005, the DC offset while amplifying the gap time signal with the gain from 1004 (i.e., the residual DC) may be estimated and updated. In this manner, the DC offset may be updated during the gap time when no data is being communicated, and therefore, the communication link need not be interrupted for DC offset calibration. Furthermore, by updating the DC offset during the gap time, the ADC is less likely to be saturated when the signal based on the DL subframe 402 is received.

At 1006, the receiver analog gain may be set to the same or a different value from the value in 1004 in an effort to amplify the received signal based on the DL subframe 402 without saturating the ADC. The receiver analog gain may be set at 1006 according to any suitable method for setting the analog gain, including the operations 700 based on the block diagram 650 of FIG. 6B or the operations 800 for fast AGC using CPs. Because the analog gain may have changed between the gap time when the DC offset was last updated and the DL subframe 402, the DC offset while amplifying the DL subframe 402 with the gain from 1006 may be estimated and updated again at 1007. The updated DC offset from 1007 may be used to process additional signals based on subsequent OFDM/OFDMA symbols.

By updating the DC offset during the RTG 407 before the DL subframe 402 for every OFDM/OFDMA frame, the DC offset may most likely remain calibrated despite temperature variations and long-term drift of RF front end components, for example. For some embodiments, blocks 1004 to 1005 may be repeated at any suitable frame interval, such as once every 2 frames, every 3 frames, every 4 frames, etc., rather than being repeated every frame. Also as described above for fast AGC based on CPs for some embodiments, the analog gain and corresponding DC offset may be updated every symbol according to its CP, while in other embodiments, the analog gain and the corresponding DC offset gain may be updated every 2 CPs, every 3 CPs, every 4 CPs, etc.

Whatever analog gain/DC offset update interval is selected, different OFDM/OFDMA zones within the DL subframe 402 may vary in signal power as illustrated in FIG. 5, independent of the velocity of a mobile user terminal. Therefore, DC offset calibration may most likely be conducted at the start of each different zone (e.g., each DL-PUSC zone 424 or DL-FUSC zone 426) within a DL subframe 402 in an effort to update the DC offset according to the potentially adjusted analog gain.

Referring back to FIG. 10, for each different zone in the frame at 1008, the receiver analog gain may be set at 1010 to the same or a different value from the value in 1006 in an effort to amplify the received signal for the zone without saturating the ADC, similar to the adjustment at 1006. Because the analog gain may have changed between the start of the DL subframe 402 or any DL zone and another subsequent DL zone, the DC offset while amplifying the received signal of the DL zone with the gain from 1010 may be estimated and updated again at 1012. The updated DC offset from 1012 may be used to process additional signals of the DL zone based on subsequent OFDM/OFDMA symbols in the zone. In other words, the DC offset may be estimated and updated each time the analog gain is or may be modified.

In this manner, the DC offset may most likely remain calibrated despite influences that affect the DC offset (e.g., temperature variations, variations due to the Doppler effect of fast-moving mobile stations, and long-term drift of RF front end components) without saturating the ADC due to DC offset, no matter the gain of the amplifiers in the RF front end 328'. Again, the operations 1000 of FIG. 10 avoid interrupting the communication link for DC offset calibration, thereby permitting real-time services such as VoIP and VOD to operate without disruption or running the risk of saturating the ADC, leading to invalid data.

Exemplary Combination of AGC and DC Calibration

To understand how certain embodiments of the present disclosure may work together, FIGS. 11A-G illustrate signal power levels and DC offsets in time at various stages in the block diagram 650 of FIG. 6B using the fast AGC based on CPs of FIG. 8 and the DC offset calibration of FIG. 10, for example.

FIG. 11A illustrates an example signal power 1100 as received by the antenna 330' of a receiver 304, for example. The signal power 1100 is based on an OFDM/OFDMA frame and, therefore, has an initial guard interval (during the RTG 407) with substantially no power followed by symbols with significant power from the DL subframe 402, beginning with the preamble 408 as described above. As illustrated, the signal power 1100 is fading with time, perhaps due to the antenna 330' moving further away from a serving base station, such that the last illustrated OFDM symbol 1101 in FIG. 11A has the smallest signal power of the four symbols depicted. The signal power 1100 may include some interference.

FIG. 11B illustrates an example signal power 1102 at the output of the ADC 612 after the signal power 1100 received by the antenna 330' has been amplified, mixed, filtered, or otherwise processed. During the gap time, the analog gain may be initialized according to blocks 802 or 1004. Once the gain has been initialized, this may create a residual DC offset 1103 in the signal power 1102 that should be calibrated out. The residual DC offset 1103 may be estimated during the gap time according to block 1005, for example.

Once the first CP has been received, the average signal power of the first CP in the signal power 1102 may be estimated according to block 804, and the analog gain may be adjusted according to block 806 or 1006, for example. Thus, the signal power 1102 had an initial gain, but the gain increased during the reception of the first CP such that the signal power 1102 is significantly greater than the signal power 1100. Based on the block diagram 650 with the two separate AP blocks 652, 658, the signal power 1100 may be properly amplified in the presence of large interference signals to the signal power 1102 without saturating the ADC 612, according to embodiments of the present disclosure described above.

If the last illustrated OFDM symbol 1101 is the first symbol of a new zone, then the average signal power of the first CP of the new zone may be estimated according to block 814, for example, as shown for signal power 1102. The analog gain for the new zone may be adjusted according to block 816 or 1010, for example. By adjusting the analog gain for the new zone, the signal power 1102 for the last illustrated OFDM symbol 1101 may be amplified to a similar signal power as the first OFDM symbol containing the preamble 408 for the signal power 1102 at the output of the ADC, in spite of the fading received signal power 1100.

FIG. 11C illustrates an example signal power 1104 at the output of the digital filter 614 after the interference has been removed. Because of the removal of the interference, the signal power 1104 may be significantly smaller than the signal power 1102 at the output of the ADC 612. The DC offset may be estimated by the DC estimator 622 during the first portion of the OFDM/OFDMA frame (e.g., in the preamble 408 as the first symbol) according to block 1007, for example, and perhaps again in a subsequent symbol as illustrated in FIG. 11C. The DC offset may also be estimated by the DC estimator 622 during the first symbol of a different DL zone (i.e., the last illustrated symbol 1101) according to block 1012, for example, as illustrated.

FIG. 11D illustrates an example signal power 1106 at the output of the DC compensator 656. The signal power 1106 is similar to the signal power 1104, except that DC compensation may have been activated during a data portion of the same symbol with the CP used to estimate the signal power according to block 808 and again during a data portion of a subsequent symbol according to block 808 or 818, for example. In this manner, the DC offset from the DC estimator 622 (as measured according to block 1007 or 1010, for example) may be removed from the signal power 1104 in an effort to correctly estimate the signal power and properly set the digital gain. Note the DC offset deviations 1107 in the signal power 1106.

FIG. 11E illustrates an example signal power 1108 at the output of the buffer 624, portraying a delayed version of the signal power 1104 at the output of the digital filter 614. The gain and offset of the signal power 1108 may most likely be the same as the signal power 1104.

FIG. 11F illustrates an example signal power 1110 at the output of the summer 626, depicting a DC-adjusted version of the signal power 1108 at the output of the buffer 624 according to the DC estimates made by the DC estimator 622 on the signal power 1104 at the output of the digital filter 614 according to block 1007 or 1010, for example. The signal power 1110 illustrates the desired removal of the residual DC offset 1103 if the DC estimates were performed correctly.

FIG. 11G illustrates an example signal power 1112 at the output of the multiplier 628 after digital automatic gain control based on the estimates of the signal power 1106 have been applied according to block 810 and again according to block 810 or 820. The signal power 1112 at the output of the multiplier 628 is similar to the signal power 1110 at the output of the summer 626 with the residual DC offset 1103 removed, with the exception of the digital gain applied to the OFDM/OFDMA symbols during the symbol interval between estimates of the signal power made by the second AP block 658 to the signal power 1106. The signal power 1112 may most likely be ready for further processing by the data demodulator 630 with the DC offset and interference removed, no signal degradation due to ADC saturation, and the effects of fading mitigated for increased signal-to-interference-plus-noise ratio (SINR).

Figure 7A:
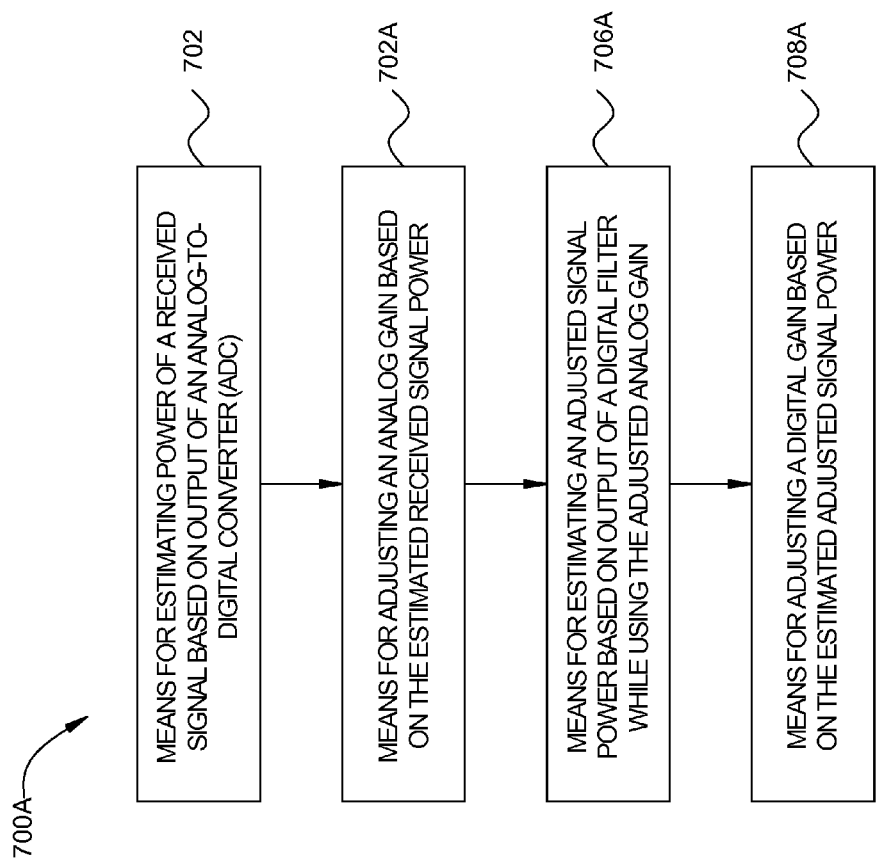
FIG. 7A is a block diagram of means corresponding to the example operations for AGC of FIG. 7, in accordance with certain embodiments of the present disclosure.

The operations described above may be performed by various hardware and/or software component(s) and/or module(s) corresponding to a number of means-plus-function blocks. For example, the operations 700 of FIG. 7 described above may be performed by various hardware and/or software component(s) and/or module(s) corresponding to the means-plus-function blocks 700A illustrated in FIG. 7A. In other words, blocks 702 through 708 illustrated in FIG. 7 correspond to means-plus-function blocks 702A through 708A illustrated in FIG. 7A.

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

Information and signals may be represented using any of a variety of different technologies and techniques. For example, data, instructions, commands, information, signals and the like that may be referenced throughout the above description may be represented by voltages, currents, electromagnetic waves, magnetic fields or particles, optical fields or particles or any combination thereof.

The various illustrative logical blocks, modules and circuits described in connection with the present disclosure may be implemented or performed with a general purpose processor, a digital signal processor (DSP), an application specific integrated circuit (ASIC), a field programmable gate array signal (FPGA) or other programmable logic device (PLD), discrete gate or transistor logic, discrete hardware components or any combination thereof designed to perform the functions described herein. A general purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the present disclosure may be embodied directly in hardware, in a software module executed by a processor, or in a combination of the two. A software module may reside in any form of storage medium that is known in the art. Some examples of storage media that may be used include random access memory (RAM), read only memory (ROM), flash memory, EPROM memory, EEPROM memory, registers, a hard disk, a removable disk, a CD-ROM and so forth. A software module may comprise a single instruction, or many instructions, and may be distributed over several different code segments, among different programs, and across multiple storage media. A storage medium may be coupled to a processor such that the processor can read information from, and write information to, the storage medium. In the alternative, the storage medium may be integral to the processor.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

The functions described may be implemented in hardware, software, firmware, or any combination thereof. If implemented in software, the functions may be stored as one or more instructions on a computer-readable medium. A storage media may be any available media that can be accessed by a computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code in the form of instructions or data structures and that can be accessed by a computer. Disk and disc, as used herein, include compact disc (CD), laser disc, optical disc, digital versatile disc (DVD), floppy disk, and Blu-ray® disc where disks usually reproduce data magnetically, while discs reproduce data optically with lasers.

Software or instructions may also be transmitted over a transmission medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of transmission medium.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method for DC calibration in a wireless communication system, comprising:

setting an analog gain of a signal received over a communications link within a predetermined Receive/Transmit Transition gap (RTG) during normal traffic exchange over the communications link and before a downlink (DL) subframe of the received signal is received by a user equipment (UE) from a base station, wherein setting the analog gain to vary according to each different downlink zone within an orthogonal frequency-division multiplexing (OFDM) or orthogonal frequency division multiple access (OFDMA) frame;

amplifying a portion of the received signal using an analog gain setting for a downlink zone in the OFDM or OFDMA frame during the portion of the received signal based on the downlink zone;

estimating a downlink zone DC offset of the amplified portion of the received signal within the predetermined RTG during the normal traffic exchange over the communications link and before the downlink (DL) subframe of the received signal is received by the user equipment (UE) from the base station; and updating a DC offset by applying the estimated downlink zone DC offset to the amplified portion of the received signal within the predetermined Receive/Transmit Transition gap before the downlink subframe of the OFDM or OFDMA frame.

2. The method of claim 1, further comprising:

setting the analog gain to amplify a portion of the received signal based on the DL subframe of the OFDM or OFDMA frame;

estimating a DC offset of the amplified portion of the received signal; and applying the estimated DC offset to the amplified portion of the received signal.

3. The method of claim 2, further comprising estimating power of the received signal based on a cyclic prefix (CP) of an OFDM or OFDMA symbol of the DL subframe before setting the analog gain for the amplified portion of the received signal.

4. The method of claim 1, further comprising estimating power of the received signal based on a cyclic prefix (CP) of an OFDM or OFDMA symbol of the zone before setting the analog gain for the amplified portion of the received signal.

5. The method of claim 1, further comprising calibrating the DC offset during initialization before setting the analog gain.

6. A receiver for wireless communication, comprising:

gain setting logic configured to set an analog gain for a signal received by the receiver over a communications link within a predetermined Receive/Transmit Transition gap (RTG) during normal traffic exchange over the communications link and before a downlink (DL) subframe of the received signal is received by a user equipment (UE) from a base station, wherein the gain setting logic is further configured to vary the analog gain setting according to each different downlink zone within an orthogonal frequency-division multiplexing (OFDM) or orthogonal frequency division multiple access (OFDMA) frame;

amplifier logic to amplify a portion of the received signal using the analog gain setting for a downlink zone in the OFDM or OFDMA frame during the portion of the received signal based on the downlink zone;

offset estimation logic configured to estimate a downlink zone DC offset of the amplified portion of the received signal within the predetermined RTG during the normal traffic exchange over the communications link and before the downlink (DL) subframe of the received signal is received by the user equipment (UE) from the base station; and adjustment logic configured to update a DC offset by applying the estimated downlink zone DC offset to the amplified portion of the received signal within the predetermined Receive/Transmit Transition gap before the downlink subframe of the OFDM or OFDMA frame.

7. The receiver of claim 6, wherein the gain setting logic is configured to set the analog gain to amplify a portion of the received signal based on the DL subframe of the OFDM or OFDMA frame, wherein the offset estimation logic is configured to estimate a DC offset of the amplified portion of the received signal, and wherein the adjustment logic is configured to apply the estimated DC offset to the amplified portion of the received signal.

8. The receiver of claim 7, further comprising power estimation logic configured to estimate power of the received signal based on a cyclic prefix (CP) of an OFDM or OFDMA symbol of the DL subframe before setting the analog gain for the amplified portion of the received signal.

9. The receiver of claim 6, further comprising power estimation logic configured to estimate power of the received signal based on a cyclic prefix (CP) of an OFDM or OFDMA symbol of the zone before setting the analog gain for the amplified portion of the received signal.

10. The receiver of claim 6, further comprising calibration logic configured to calibrate the DC offset during initialization before setting the analog gain.

11. An apparatus for DC calibration in a wireless communication system, comprising:

means for setting an analog gain of a signal received over a communications link within a predetermined Receive/Transmit Transition gap (RTG) during normal traffic exchange over the communications link and before a downlink (DL) subframe of the received signal is received by a user equipment (UE) from a base station, wherein setting the analog gain to vary according to each different downlink zone within an orthogonal frequency-division multiplexing (OFDM) or orthogonal frequency division multiple access (OFDMA) frame;

means for amplifying a portion of the received signal using an analog gain setting for a downlink zone in the OFDM or OFDMA frame during the portion of the received signal based on the downlink zone;

means for estimating a downlink zone DC offset of the amplified portion of the received signal within the predetermined RTG during the normal traffic exchange over the communications link and before the downlink (DL) subframe of the received signal is received by the user equipment (UE) from the base station; and means for updating a DC offset by applying the estimated downlink zone DC offset to the amplified portion of the received signal within the predetermined Receive/Transmit Transition gap before the downlink subframe of the OFDM or OFDMA frame.

12. The apparatus of claim 11, further comprising: means for setting the analog gain to amplify a portion of the received signal based on the DL subframe of the OFDM or OFDMA frame; means for estimating a DC offset of the amplified portion of the received signal; and means for applying the estimated DC offset to the amplified portion of the received signal.

13. The apparatus of claim 12, further comprising means for estimating power of the received signal based on a cyclic prefix (CP) of an OFDM or OFDMA symbol of the DL subframe before setting the analog gain for the amplified portion of the received signal.

14. The apparatus of claim 11, further comprising means for estimating power of the received signal based on a cyclic prefix (CP) of an OFDM or OFDMA symbol of the zone before setting the analog gain for the amplified portion of the received signal.

15. The apparatus of claim 11, further comprising means for calibrating the DC offset during initialization before setting the analog gain.

16. A mobile device, comprising:

a receiver front end for receiving a signal based on an orthogonal frequency-division multiplexing (OFDM) or orthogonal frequency division multiple access (OFDMA) frame;

gain setting logic configured to set an analog gain for the received signal within a predetermined Receive/Transmit Transition gap (RTG) during normal traffic exchange over a communications link and before a downlink (DL) subframe of the received signal is received by a user equipment (UE) from a base station, wherein the gain setting logic is further configured to vary the analog gain setting according to each different downlink zone within the OFDM or OFDMA frame;

amplifier logic to amplify a portion of the received signal using the analog gain setting for a downlink zone in the OFDM or OFDMA frame during the portion of the received signal based on the downlink zone;

estimation logic configured to estimate a downlink zone DC offset of the amplified portion of the received signal during the predetermined RTG during the normal traffic exchange over the communications link and before the downlink (DL) subframe of the received signal is received by the user equipment (UE) from the base station; and adjustment logic configured to update a DC offset by applying the estimated downlink zone DC offset to the amplified portion of the received signal within the predetermined Receive/Transmit Transition gap before the downlink subframe of the OFDM or OFDMA frame.

17. The mobile device of claim 16, wherein the gain setting logic is configured to set the analog gain to amplify a portion of the received signal based on the DL subframe of the OFDM or OFDMA frame, wherein the offset estimation logic is configured to estimate a DC offset of the amplified portion of the received signal, and wherein the adjustment logic is configured to apply the estimated DC offset to the amplified portion of the received signal.

18. The mobile device of claim 17, further comprising power estimation logic configured to estimate power of the received signal based on a cyclic prefix (CP) of an OFDM or OFDMA symbol of the DL subframe before setting the analog gain for the amplified portion of the received signal.

19. The mobile device of claim 16, further comprising power estimation logic configured to estimate power of the received signal based on a cyclic prefix (CP) of an OFDM or OFDMA symbol of the zone before setting the analog gain for the amplified portion of the received signal.

20. The mobile device of claim 16, further comprising calibration logic configured to calibrate the DC offset during initialization before setting the analog gain.

21. A non-transitory computer-readable medium containing a program for DC calibration in a wireless communication system, which, when executed by a processor, performs operations comprising:

setting an analog gain of a signal received over a communications link within a predetermined Receive/Transmit Transition gap (RTG) during normal traffic exchange over the communications link and before a downlink (DL) subframe of the received signal is received by a user equipment (UE) from a base station, wherein setting the analog gain to vary according to each different downlink zone within an orthogonal frequency-division multiplexing (OFDM) or orthogonal frequency division multiple access (OFDMA) frame;

amplifying a portion of the received signal using an analog gain setting for a downlink zone in the OFDM or OFDMA frame during the portion of the received signal based on the downlink zone;

estimating a downlink zone DC offset of the amplified portion of the received signal within the predetermined RTG during the normal traffic exchange over the communications link and before the downlink (DL) subframe of the received signal is received by the user equipment (UE) from the base station; and updating a DC offset by applying the estimated downlink zone DC offset to the amplified portion of the received signal within the predetermined Receive/Transmit Transition gap before the downlink subframe of the OFDM or OFDMA frame.

22. The non-transitory computer-readable medium of claim 21, wherein the operations comprise: setting the analog gain to amplify a portion of the received signal based on the DL subframe of the OFDM or OFDMA frame; estimating a DC offset of the amplified portion of the received signal; and applying the estimated DC offset to the amplified portion of the received signal.

23. The non-transitory computer-readable medium of claim 22, wherein the operations comprise estimating power of the received signal based on a cyclic prefix (CP) of an OFDM or OFDMA symbol of the DL subframe before setting the analog gain for the amplified portion of the received signal.

24. The non-transitory computer-readable medium of claim 21, wherein the operations comprise estimating power of the received signal based on a cyclic prefix (CP) of an OFDM or OFDMA symbol of the zone before setting the analog gain for the amplified portion of the received signal.

25. The non-transitory computer-readable medium of claim 21, wherein the operations comprise calibrating the DC offset during initialization before setting the analog gain.

\* \* \* \* \*